United States Patent
Iwata et al.

(10) Patent No.: US 10,464,107 B2
(45) Date of Patent: Nov. 5, 2019

(54) SUBSTRATE PROCESSING METHOD AND SUBSTRATE PROCESSING APPARATUS

(71) Applicant: SCREEN Holdings Co., Ltd., Kyoto (JP)

(72) Inventors: Keiji Iwata, Kyoto (JP); Sei Negoro, Kyoto (JP); Tomohiro Uemura, Kyoto (JP); Yuji Sugahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 691 days.

(21) Appl. No.: 14/519,739

(22) Filed: Oct. 21, 2014

(65) Prior Publication Data

US 2015/0114432 A1 Apr. 30, 2015

(30) Foreign Application Priority Data

Oct. 24, 2013 (JP) ................................ 2013-221489
Dec. 4, 2013 (JP) ................................ 2013-251192

(51) Int. Cl.
*H01L 21/67* (2006.01)
*H01L 21/02* (2006.01)
*B08B 3/02* (2006.01)

(52) U.S. Cl.
CPC ............ *B08B 3/02* (2013.01); *H01L 21/6708* (2013.01); *H01L 21/02057* (2013.01)

(58) Field of Classification Search
None
See application file for complete search history.

(56) References Cited

U.S. PATENT DOCUMENTS

| 5,593,538 A * | 1/1997 | Davison ............ H01L 21/31111 |
| | | 216/84 |
| 6,299,697 B1 * | 10/2001 | Nishibe ................... G03F 7/423 |
| | | 134/100.1 |
| 2004/0000322 A1 | 1/2004 | Verhaverbeke ................ 134/1.3 |
| 2005/0158671 A1 | 7/2005 | Shimizu et al. .............. 430/329 |
| 2007/0045231 A1 | 3/2007 | Wada .............................. 216/83 |
| 2007/0082496 A1 | 4/2007 | Orii et al. ..................... 438/737 |
| 2008/0283090 A1 | 11/2008 | DeKraker et al. ................ 134/3 |
| 2008/0293252 A1 * | 11/2008 | Wada ...................... G03F 7/423 |
| | | 438/745 |
| 2009/0211610 A1 | 8/2009 | Honbe et al. ................... 134/26 |
| 2010/0227461 A1 | 9/2010 | Ochi ............................. 438/586 |
| 2010/0317185 A1 | 12/2010 | Vos et al. ..................... 438/591 |

(Continued)

FOREIGN PATENT DOCUMENTS

JP S61-071635 A 4/1986
JP 05-121388 5/1993

(Continued)

*Primary Examiner* — Eric W Golighly
*Assistant Examiner* — Arlyn I Rivera-Cordero
(74) *Attorney, Agent, or Firm* — Ostrolenk Faber LLP

(57) ABSTRACT

A substrate processing method for removing a resist from a substrate, the substrate comprising a surface layer which has been cured, and having a pattern disposed inside the resist. The method includes an SPM supplying step of supplying an SPM, formed by mixing sulfuric acid and a hydrogen peroxide solution, to the substrate and a liquid temperature increasing step of changing, in parallel to the SPM supplying step, a mixing ratio of the sulfuric acid and the hydrogen peroxide solution used to form the SPM to increase the liquid temperature of the SPM supplied to the substrate in the SPM supplying step.

19 Claims, 15 Drawing Sheets

(56) References Cited

U.S. PATENT DOCUMENTS

| | | | |
|---|---|---|---|
| 2011/0253176 A1 | 10/2011 | Saito | 134/26 |
| 2011/0259376 A1 | 10/2011 | Wagener et al. | 134/94.1 |
| 2012/0052687 A1* | 3/2012 | Raghavan | G03F 7/423 |
| | | | 438/705 |
| 2012/0074101 A1 | 3/2012 | Nakamura | 216/83 |
| 2012/0160274 A1 | 6/2012 | Kasai et al. | 134/26 |
| 2013/0014787 A1 | 1/2013 | Urata et al. | 134/100.1 |
| 2013/0084709 A1 | 4/2013 | Miyagi et al. | 438/745 |
| 2013/0224956 A1 | 8/2013 | Negoro et al. | 438/697 |
| 2013/0233351 A1 | 9/2013 | Brown | 134/18 |
| 2014/0007902 A1* | 1/2014 | Brown | H01L 21/67057 |
| | | | 134/1.3 |

FOREIGN PATENT DOCUMENTS

| | | |
|---|---|---|
| JP | 2002-511644 A | 4/2002 |
| JP | 2004-273838 A | 9/2004 |
| JP | 2005-026489 A | 1/2005 |
| JP | 2005-183937 A | 7/2005 |
| JP | 2005-268308 A | 9/2005 |
| JP | 2007-59816 A | 3/2007 |
| JP | 2007-109724 A | 4/2007 |
| JP | 2007-258565 A | 10/2007 |
| JP | 2007-324548 | 12/2007 |
| JP | 2008-004878 | 1/2008 |
| JP | 2008-066400 | 3/2008 |
| JP | 2008-209542 | 9/2008 |
| JP | 2008-235341 A | 10/2008 |
| JP | 2008-235342 A | 10/2008 |
| JP | 2008-246319 A | 10/2008 |
| JP | 2008-270824 A | 11/2008 |
| JP | 2009-200365 A | 9/2009 |
| JP | 2009-238862 A | 10/2009 |
| JP | 2009-267167 A | 11/2009 |
| JP | 2010-206056 A | 9/2010 |
| JP | 2010-287752 A | 12/2010 |
| JP | 2011-071169 A | 4/2011 |
| JP | 2011-228438 A | 11/2011 |
| JP | 2012-074475 A | 4/2012 |
| JP | 2012-138510 A | 7/2012 |
| JP | 2012-156264 | 8/2012 |
| JP | 2013-21178 A | 1/2013 |
| JP | 2013-058790 A | 3/2013 |
| JP | 2013-065823 | 4/2013 |
| JP | 2013-074090 | 4/2013 |
| JP | 2013-77624 A | 4/2013 |
| JP | 2013-77626 A | 4/2013 |
| JP | 2013-521658 | 6/2013 |
| JP | 2013-526056 A | 6/2013 |
| JP | 2013-182957 A | 9/2013 |
| JP | 2013-187548 | 9/2013 |
| JP | 2013-207080 A | 10/2013 |
| KR | 10-1998-0040600 A | 8/1998 |
| KR | 10-2013-0035202 | 4/2013 |
| TW | 200941612 A | 10/2009 |
| WO | WO 99/52654 | 10/1999 |
| WO | WO 2011/109540 A1 | 9/2011 |
| WO | WO 2013/031390 A1 | 3/2013 |

* cited by examiner

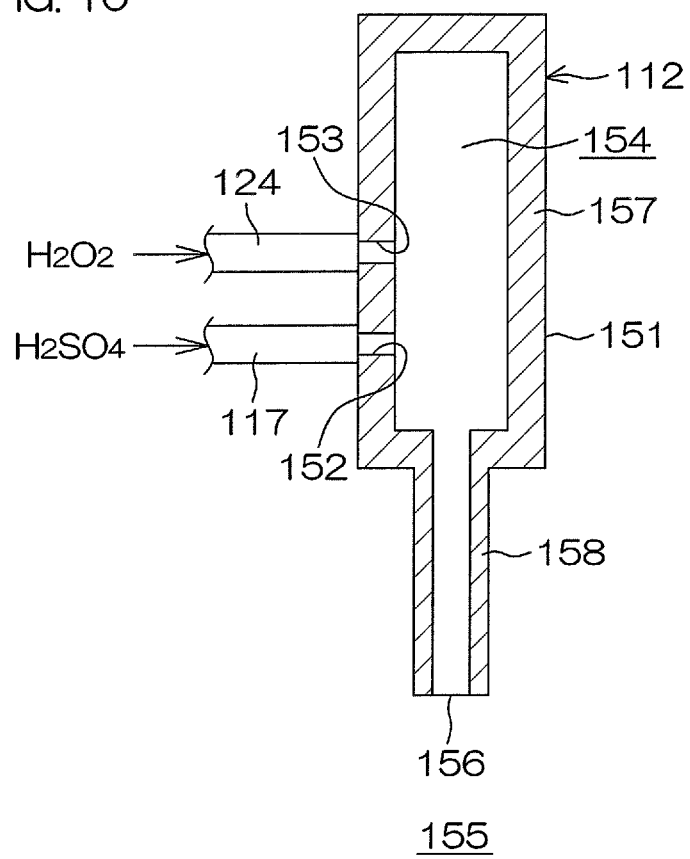

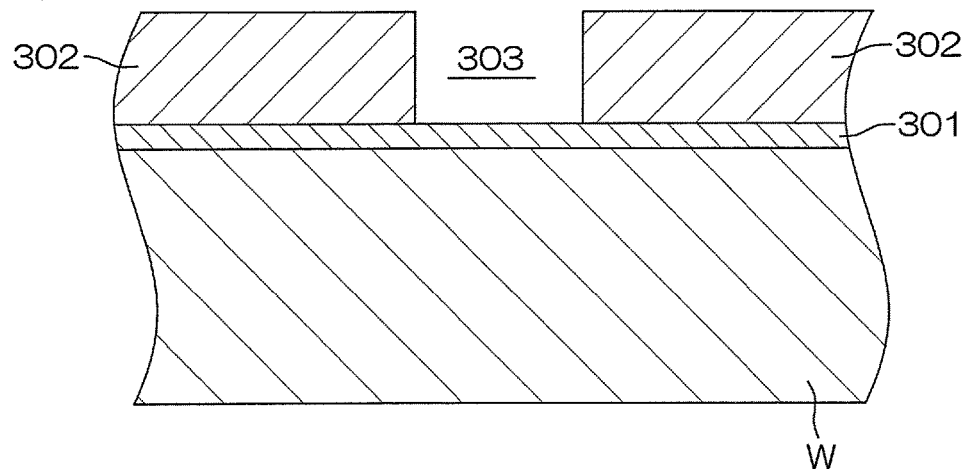
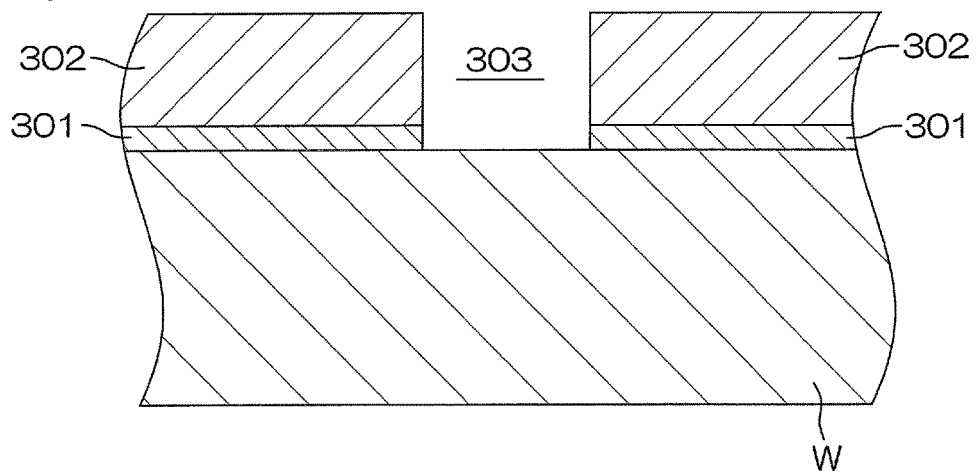

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate. Examples of substrates to be processed include semiconductor wafers, substrates for liquid crystal displays, substrates for plasma display devices, substrates for FEDs (Field Emission Display devices), substrates for optical disks, substrates for magnetic disks, substrates for magneto-optical disks, substrates for photo masks, ceramic substrates, substrates for solar cells, etc.

2. Description of Related Art

In a manufacturing process for a semiconductor device or a liquid crystal display, etc., a resist stripping process of removing unneeded resist from semiconductor wafers or glass substrates for liquid crystal display device, etc., is performed.

A method for removing a resist, the surface layer of which has been cured by ion implantation, from a substrate by supplying a high-temperature SPM (sulfuric acid/hydrogen peroxide mixture) to the substrate is disclosed in Japanese Patent Application Publication No. 2008-4878.

A method for removing a resist, the surface layer of which has been cured by dry etching, from a substrate by popping the cured layer of resist by heating the substrate is disclosed in Japanese Patent Application Publication No. 2008-209542.

SUMMARY OF THE INVENTION

A general resist contains a photosensitive resin and a solvent. When a substrate that is covered with a resist, the interior of which is sealed by a cured surface layer, is heated rapidly, the solvent in the interior of the resist vaporizes instantly and the internal pressure of the resist rises rapidly. The cured layer of resist thus pops due to the rapid rise of internal pressure, and the cured layer, which cannot be stripped easily, is thereby destroyed. However, when a pattern is disposed in the interior of such a resin (see, for example, FIG. 7), the pattern may be damaged by the impact generated when the cured layer pops. In a case where a resist is removed by supplying an SPM, it may be considered that the popping of the resist can be suppressed or prevented by decreasing the temperature of the SPM supplied to the substrate. However, when the temperature of the SPM is decreased, the stripping ability of the SPM decreases and it may not be possible to remove the resist from the substrate reliably.

An object of the present invention is thus to provide a substrate processing apparatus and a substrate processing method by which a resist, the surface layer of which has been cured, can be removed from a substrate having a pattern disposed inside the resist, while suppressing or preventing the occurrence of pattern damage.

The present invention provides a substrate processing method that is a method for removing a resist, the surface layer of which has been cured, from a substrate having a pattern disposed inside the resist and includes an SPM supplying step of supplying an SPM, formed by mixing sulfuric acid and a hydrogen peroxide solution, to the substrate and a liquid temperature increasing step of changing, in parallel to the SPM supplying step, a mixing ratio of the sulfuric acid and the hydrogen peroxide solution used to form the SPM to increase the liquid temperature of the SPM supplied to the substrate in the SPM supplying step.

With this method, the SPM is formed by mixing the sulfuric acid and the hydrogen peroxide solution. The SPM thus formed is supplied to the substrate that is covered by the resist, with which the surface layer has been cured but the interior has not been cured. The mixing ratio of the sulfuric acid and the hydrogen peroxide solution used to form the SPM is changed when the SPM is being supplied to the substrate and the liquid temperature of the SPM supplied to the substrate is thereby increased to a stripping temperature suited for stripping the resist. The cured layer positioned at the surface layer of the resist reacts with the SPM that increases in liquid temperature. Holes joining the interior and the exterior of the resist are thereby formed in the cured layer in the process of increase of the liquid temperature of the SPM. Therefore, even if the uncured layer of the resist vaporizes, the vaporized components are expelled through the holes in the cured layer and the internal pressure of the resist does not rise easily. Popping of the resist (popping of the cured layer) is thus unlikely to occur in comparison to a case where the SPM of the stripping temperature is supplied to the substrate from the beginning. The resist can thereby be removed from the substrate while suppressing or preventing the damaging of the pattern disposed inside the resist.

A preferred embodiment of the present invention further includes a heating step of heating the substrate before the SPM supplying step to make the temperature of the substrate approach the liquid temperature of the SPM at the start of the liquid temperature increasing step.

With this method, before the SPM is supplied to the substrate, the substrate is heated to make the temperature of the substrate approach the liquid temperature (initial temperature) of the SPM when the supply of the SPM to the substrate is started. The temperature of the resist can thereby be suppressed or prevented from increasing rapidly due to the start of supplying of the SPM. The internal pressure of the resist can thereby be suppressed or prevented from increasing rapidly at the start of supplying of the SPM even when the initial temperature of the SPM is high. Occurrence of pattern damage due to popping of the resist can thereby be suppressed or prevented.

The method may further include an antistatic liquid supplying step of supplying a conductive antistatic liquid with a higher specific resistance than the SPM to the substrate before the SPM supplying step.

With this method, the antistatic liquid, which conducts electricity, is supplied to the substrate before the SPM is supplied to the substrate. Therefore, when the substrate is charged, the charges move from the substrate to the antistatic liquid and the charges are removed from the substrate. In particular, the specific resistance of the antistatic liquid is greater than the specific resistance of the SPM and therefore the charges move slowly from the substrate to the antistatic liquid. Damaging of a device formed on the substrate due to heat generation caused by rapid movement of charges can thus be prevented. Degradation of quality of the substrate can thereby be suppressed or prevented.

The method may further include a hydrogen peroxide solution supplying step of supplying the hydrogen peroxide solution to the substrate after the antistatic liquid supplying step and before the SPM supplying step to rinse off the antistatic liquid remaining on the substrate.

With this method, the hydrogen peroxide solution is supplied to the substrate after the antistatic liquid has been supplied to the substrate. The SPM is supplied to the substrate thereafter. The antistatic liquid remaining on the substrate is removed from the substrate by the supply of the hydrogen peroxide solution. The SPM is thus supplied to the substrate in a state in which the residual amount of the antistatic liquid is decreased. The properties of the SPM can thus be suppressed or prevented from changing significantly due to mixing of the SPM and the antistatic liquid on the substrate. The uniformity of concentration of the SPM can also be suppressed or prevented from decreasing due to the mixing of the SPM and the antistatic liquid in just a partial region of the substrate. The degradation of quality of the substrate can thereby be suppressed or prevented.

The hydrogen peroxide solution supplying step may be a step of supplying, to the substrate, the hydrogen peroxide solution of a lower temperature than the liquid temperature of the SPM at the start of the liquid temperature increasing step and the substrate processing method may further include a heating step of heating the substrate and the hydrogen peroxide solution on the substrate in parallel to the hydrogen peroxide solution supplying step to make the temperature of the substrate approach the liquid temperature of the SPM at the start of the liquid temperature increasing step.

With this method, the hydrogen peroxide solution of lower temperature than the initial temperature of the SPM (the liquid temperature of the SPM when the supply of the SPM to the substrate is started) is supplied to the substrate after the antistatic liquid has been supplied to the substrate. The substrate is heated when the hydrogen peroxide solution is held on the substrate and the temperature of the substrate is thereby made to approach the initial temperature of the SPM. The temperature of the resist can thus be suppressed or prevented from increasing rapidly due to the start of supplying of the SPM. The occurrence of pattern damage due to popping of the resist can thereby be suppressed or prevented.

In another preferred embodiment of the present invention, the SPM supplying step includes a step of supplying the sulfuric acid to a mixing portion via a sulfuric acid piping, supplying the hydrogen peroxide solution to the mixing portion via a hydrogen peroxide solution piping, and supplying the SPM, formed by the mixing of the sulfuric acid and the hydrogen peroxide solution at the mixing portion, to the substrate, and the substrate processing method further includes a hydrogen peroxide solution supplying step of supplying the hydrogen peroxide solution to the substrate by supplying the hydrogen peroxide solution to the mixing portion via the hydrogen peroxide solution piping after the SPM supplying step is ended, and a suction step of suctioning the interior of the hydrogen peroxide solution piping after the hydrogen peroxide solution supplying step is ended.

With this method, when the SPM is to be supplied to the substrate, the sulfuric acid flows through the interior of the sulfuric acid piping to be supplied to the mixing portion and the hydrogen peroxide solution flows through the interior of the hydrogen peroxide solution piping to be supplied to the mixing portion. The SPM formed at the mixing portion is then supplied to the SPM.

Also, when the hydrogen peroxide solution is to be supplied to the substrate, only the hydrogen peroxide solution is made to flow through the interior of the hydrogen peroxide solution piping to be supplied to the mixing portion without the sulfuric acid being supplied to the mixing portion. The hydrogen peroxide solution is then supplied to the substrate.

After the end of the supply of the hydrogen peroxide solution, the hydrogen peroxide solution present in the interior of the hydrogen peroxide solution piping is suctioned. All or a portion of the hydrogen peroxide solution is thereby eliminated from within the hydrogen peroxide solution piping and consequently, a tip surface of the hydrogen peroxide solution in the hydrogen peroxide solution piping is retracted.

The tip surface of the hydrogen peroxide solution in the hydrogen peroxide solution piping is retracted and therefore at the start of the subsequent supplying of the SPM, the sulfuric acid is supplied to the substrate prior to the SPM. Prior supplying of the hydrogen peroxide solution can thus be prevented reliably at the start of the subsequent supplying of the SPM. Prior supplying of the hydrogen peroxide solution to the substrate can thus be prevented reliably without causing increase of the SPM consumption amount or decrease of throughput.

When the sulfuric acid and the hydrogen peroxide solution are compared, the sulfuric acid is higher in wettability on the hydrophobic substrate. Therefore, the SPM spreads more readily on the substrate when the sulfuric acid is supplied in advance at the start of the supply of the SPM. Although when the liquid forms droplets (becomes spherical) instead of spreading, gas-liquid interfaces are formed to cause increase of particles and formation of watermarks thereat, this can be prevented. The formation of particles on the substrate front surface can thus be suppressed or prevented even when the front surface of the substrate exhibits hydrophobicity.

The SPM supplying step may include a simultaneous valve opening step of simultaneously opening a sulfuric acid valve arranged to open and close the sulfuric acid piping and a hydrogen peroxide solution valve arranged to open and close the hydrogen peroxide solution piping.

With this method, although the sulfuric acid valve and the hydrogen peroxide solution valve are opened simultaneously at the start of the subsequent supplying of the SPM, the sulfuric acid is supplied to the substrate prior to the SPM because the tip surface of the hydrogen peroxide solution in the hydrogen peroxide solution piping is retracted after the end of the previous supplying of the SPM. Prior supplying of the hydrogen peroxide solution to the substrate can thereby be prevented more reliably.

The present invention provides a substrate processing apparatus that is an apparatus arranged to remove a resist, the surface layer of which has been cured, from a substrate having a pattern disposed inside the resist and includes an SPM forming unit forming an SPM by mixing a sulfuric acid and a hydrogen peroxide solution, an SPM supplying unit supplying the SPM, formed by the SPM forming unit, to the substrate, a mixing ratio changing unit changing a mixing ratio of the sulfuric acid and the hydrogen peroxide solution used to form the SPM, and a controller controlling the SPM forming unit, the SPM supplying unit, and the mixing ratio changing unit.

The controller executes an SPM supplying step of making the SPM supplying unit supply the SPM, formed by making the SPM forming unit mix the sulfuric acid and the hydrogen peroxide solution, to the substrate, and a liquid temperature increasing step of making the mixing ratio changing unit change the mixing ratio of the sulfuric acid and the hydrogen peroxide solution used to form the SPM in parallel to the SPM supplying step to increase the liquid temperature of the SPM supplied to the substrate in the SPM supplying step.

With this arrangement, the SPM is formed by mixing the sulfuric acid and the hydrogen peroxide solution. The SPM thus formed is supplied to the substrate that is covered by the resist, with which the surface layer has been cured but the interior has not been cured. The mixing ratio of the sulfuric acid and the hydrogen peroxide solution used to form the SPM is changed when the SPM is being supplied to the substrate and the liquid temperature of the SPM supplied to the substrate is thereby increased to a stripping temperature suited for stripping the resist. The cured layer positioned at the surface layer of the resist reacts with the SPM that increases in liquid temperature. Holes joining the interior and the exterior of the resist are thereby formed in the cured layer in the process of increase of the liquid temperature of the SPM. Therefore, even if the uncured layer of the resist vaporizes, the vaporized components are expelled through the holes in the cured layer and the internal pressure of the resist does not rise easily. Popping of the resist (popping of the cured layer) is thus unlikely to occur in comparison to a case where the SPM of the stripping temperature is supplied to the substrate from the beginning. The resist can thereby be removed from the substrate while suppressing or preventing the damaging of the pattern disposed inside the resist.

In a preferred embodiment of the present invention, the substrate processing apparatus further includes a heating unit heating the substrate and the controller further executes, before the SPM supplying step, a heating step of making the heating unit heat the substrate to make the temperature of the substrate approach the liquid temperature of the SPM at the start of the liquid temperature increasing step.

With this arrangement, before the SPM is supplied to the substrate, the substrate is heated to make the temperature of the substrate approach the liquid temperature (initial temperature) of the SPM when the supply of the SPM to the substrate is started. The temperature of the resist can thereby be suppressed or prevented from increasing rapidly due to the start of supplying of the SPM. The internal pressure of the resist can thereby be suppressed or prevented from increasing rapidly at the start of supplying of the SPM even when the initial temperature of the SPM is high. Occurrence of pattern damage due to popping of the resist can thereby be suppressed or prevented.

The substrate processing apparatus may further include an antistatic liquid supplying unit supplying a conductive antistatic liquid with a higher specific resistance than the SPM to the substrate, and the controller may further execute an antistatic liquid supplying step of making the antistatic liquid supplying unit supply the conductive antistatic liquid with the higher specific resistance than the SPM to the substrate before the SPM supplying step.

With this arrangement, the antistatic liquid, which conducts electricity, is supplied to the substrate before the SPM is supplied to the substrate. Therefore, when the substrate is charged, the charges move from the substrate to the antistatic liquid and the charges are removed from the substrate. In particular, the specific resistance of the antistatic liquid is greater than the specific resistance of the SPM and therefore the charges move slowly from the substrate to the antistatic liquid. Damaging of a device formed on the substrate due to heat generation caused by rapid movement of charges can thus be prevented. Degradation of quality of the substrate can thereby be suppressed or prevented.

The substrate processing apparatus may further include a hydrogen peroxide solution supplying unit supplying the hydrogen peroxide solution to the substrate, and the controller may further execute a hydrogen peroxide solution supplying step of making the hydrogen peroxide solution supplying unit supply the hydrogen peroxide solution to the substrate after the antistatic liquid supplying step and before the SPM supplying step to rinse off the antistatic liquid remaining on the substrate.

With this arrangement, the hydrogen peroxide solution is supplied to the substrate after the antistatic liquid has been supplied to the substrate. The SPM is supplied to the substrate thereafter. The antistatic liquid remaining on the substrate is removed from the substrate by the supply of the hydrogen peroxide solution. The SPM is thus supplied to the substrate in a state in which the residual amount of the antistatic liquid is decreased. The properties of the SPM can thus be suppressed or prevented from changing significantly due to mixing of the SPM and the antistatic liquid on the substrate. The uniformity of concentration of the SPM can also be suppressed or prevented from decreasing due to the mixing of the SPM and the antistatic liquid in just a partial region of the substrate. The degradation of quality of the substrate can thereby be suppressed or prevented.

The substrate processing unit may further include a heating unit heating the substrate, the hydrogen peroxide solution supplying unit may be arranged to supply, to the substrate, the hydrogen peroxide solution of a lower temperature than the liquid temperature of the SPM at the start of the liquid temperature increasing step, and the controller may further execute a heating step of making the heating unit heat the substrate and the hydrogen peroxide solution on the substrate in parallel to the hydrogen peroxide solution supplying step to make the temperature of the substrate approach the liquid temperature of the SPM at the start of the liquid temperature increasing step.

With this arrangement, the hydrogen peroxide solution of lower temperature than the initial temperature of the SPM (the liquid temperature of the SPM when the supply of the SPM to the substrate is started) is supplied to the substrate after the antistatic liquid has been supplied to the substrate. The substrate is heated when the hydrogen peroxide solution is held on the substrate and the temperature of the substrate is thereby made to approach the initial temperature of the SPM. The temperature of the resist can thus be suppressed or prevented from increasing rapidly due to the start of supplying of the SPM. The occurrence of pattern damage due to popping of the resist can thereby be suppressed or prevented.

Another preferred embodiment of the present invention provides the substrate processing apparatus where the SPM forming unit includes a mixing portion, a sulfuric acid supplying unit having a sulfuric acid piping connected to the mixing portion and supplying the sulfuric acid to the mixing portion via the sulfuric acid piping, and a hydrogen peroxide solution supplying unit having a hydrogen peroxide solution piping connected to the mixing portion and supplying the hydrogen peroxide solution to the mixing portion via the hydrogen peroxide solution piping, the SPM forming unit mixes the sulfuric acid, supplied from the sulfuric acid piping, and the hydrogen peroxide solution, supplied from the hydrogen peroxide solution piping, at the mixing portion to form the SPM, the substrate processing apparatus further includes a suction unit having a hydrogen peroxide solution suction piping, connected to the hydrogen peroxide solution piping and arranged to suction the interior of the hydrogen peroxide solution piping, and suctioning the interior of the hydrogen peroxide solution piping via the hydrogen peroxide solution suction piping, the SPM supplying step executed by the controller includes a step of supplying the sulfuric acid to the mixing portion via the sulfuric acid piping and supplying the hydrogen peroxide solution to the mixing portion via the hydrogen peroxide solution piping to supply the SPM, formed at the mixing portion, to the substrate, and the controller further includes a control unit further executing a hydrogen peroxide solution supplying step of supplying the hydrogen peroxide solution to the substrate by supplying the hydrogen peroxide solution to the mixing portion via the hydrogen peroxide solution piping after the SPM supplying step is ended and a suction step of suctioning the interior of the hydrogen peroxide solution piping after the hydrogen peroxide solution supplying step is ended.

With this arrangement, when the SPM is to be supplied to the substrate, the sulfuric acid flows through the interior of the sulfuric acid piping to be supplied to the mixing portion and the hydrogen peroxide solution flows through the interior of the hydrogen peroxide solution piping to be supplied to the mixing portion. The SPM formed at the mixing portion is then supplied to the substrate.

Also, when the hydrogen peroxide solution is to be supplied to the substrate, only the hydrogen peroxide solution is made to flow through the interior of the hydrogen peroxide solution piping to be supplied to the mixing portion without the sulfuric acid being supplied to the mixing portion. The hydrogen peroxide solution is then supplied to the substrate.

After the end of the supply of the hydrogen peroxide solution, the hydrogen peroxide solution present in the interior of the hydrogen peroxide solution piping is suctioned. All or a portion of the hydrogen peroxide solution is thereby eliminated from within the hydrogen peroxide solution piping and consequently, a tip surface of the hydrogen peroxide solution in the hydrogen peroxide solution piping is retracted.

The tip surface of the hydrogen peroxide solution in the hydrogen peroxide solution piping is retracted and therefore at the start of the subsequent supplying of the SPM, the sulfuric acid is supplied to the substrate prior to the SPM. Prior supplying of the hydrogen peroxide solution can thus be prevented reliably at the start of the subsequent supplying of the SPM. Prior supplying of the hydrogen peroxide solution to the substrate can thus be prevented reliably without causing increase of the SPM consumption amount or decrease of throughput.

When the sulfuric acid and the hydrogen peroxide solution are compared, the sulfuric acid is higher in wettability on the hydrophobic substrate. Therefore, the SPM spreads more readily on the substrate when the sulfuric acid is supplied in advance at the start of the supply of the SPM. Although when the liquid forms droplets (becomes spherical) instead of spreading, gas-liquid interfaces are formed to cause increase of particles and formation of watermarks thereat, this can be prevented. The formation of particles on the substrate front surface can thus be suppressed or prevented even when the front surface of the substrate exhibits hydrophobicity.

The mixing portion may include a mixed solution nozzle having a mixing chamber in which the sulfuric acid and the hydrogen peroxide solution are mixed and a discharge port arranged to discharge the SPM formed by the mixing in the mixing chamber, and the hydrogen peroxide solution piping may be connected to the mixing chamber.

Also, the substrate processing apparatus may further include a mixed solution nozzle arranged to discharge the SPM and a mixed solution supplying piping connecting the mixing portion and the mixed solution nozzle and supplying the SPM, formed by the mixing portion, to the mixed solution nozzle.

The foregoing and other objects, features and effects of the present invention will become more apparent from the following detailed description of the preferred embodiments with reference to the attached drawings.

BRIEF DESCRIPTION OF THE DRAWINGS

FIG. 10 is an illustrative sectional view of the arrangement of an SPM nozzle shown in FIG. 9.

FIG. 11A and FIG. 11B are sectional views for describing examples of surface states of a substrate processed by the substrate processing apparatus according to the second embodiment of the present invention.

DETAILED DESCRIPTION OF PREFERRED EMBODIMENTS

Modes for Carrying Out the Invention

Figure 1:
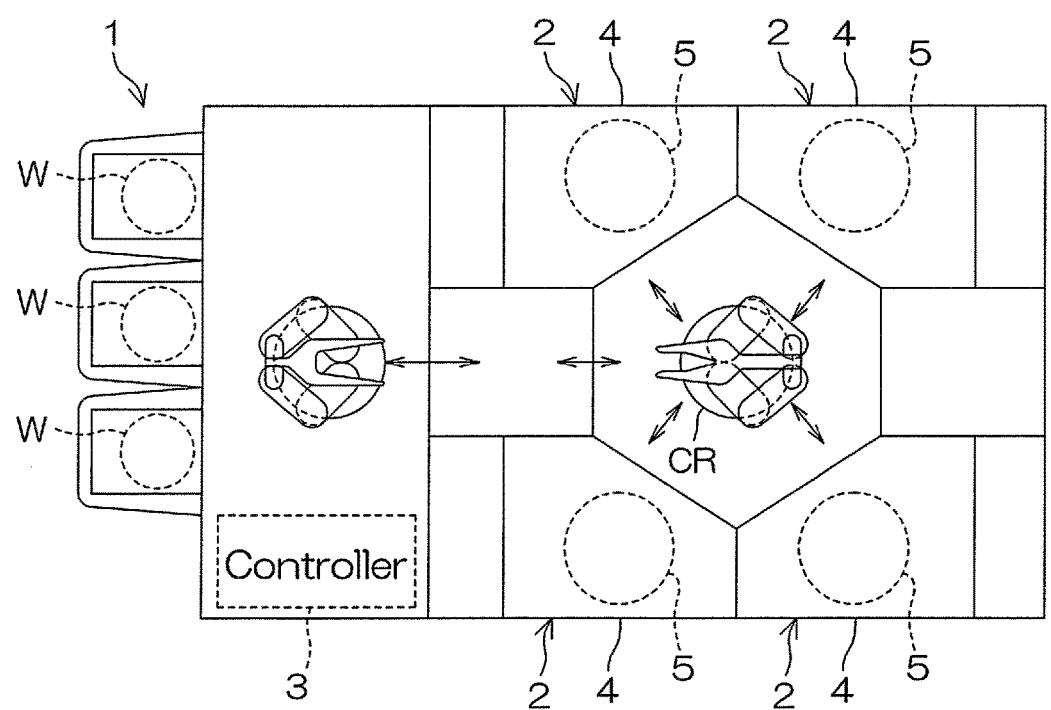
FIG. 1 is a schematic plan view of a substrate processing apparatus according to a first embodiment of the present invention.
Figure 2:
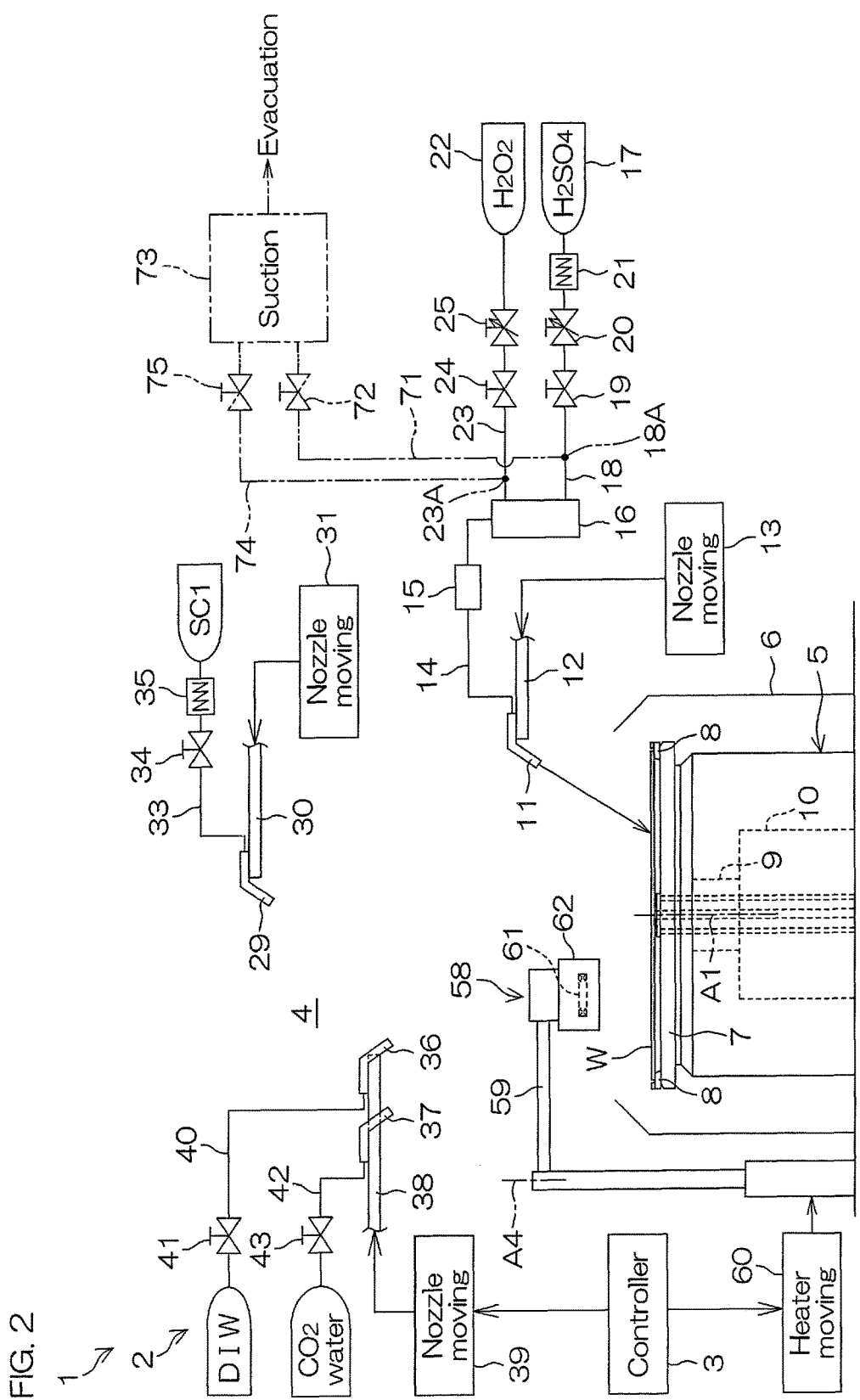
FIG. 2 is a horizontally-viewed schematic view of the interior of a chamber included in the substrate processing apparatus according to the first embodiment of the present invention.
Figure 3:
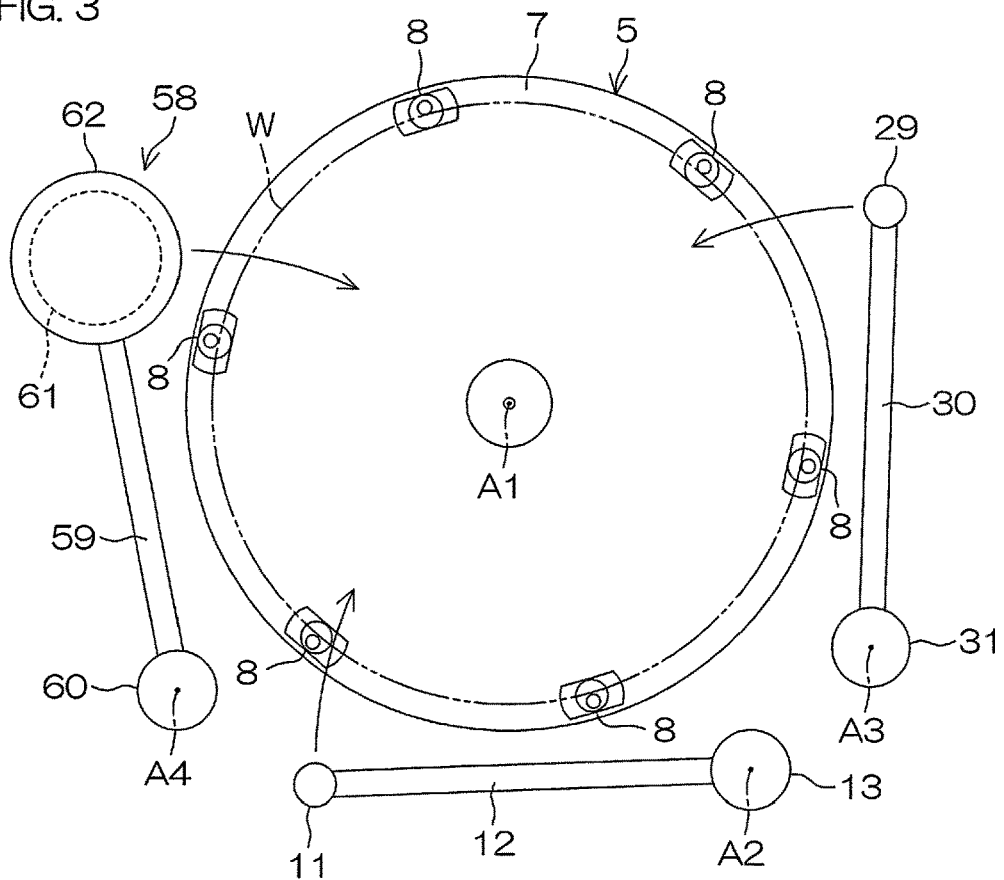
FIG. 3 is a schematic plan view of a spin base and an arrangement related thereto.
Figure 4:
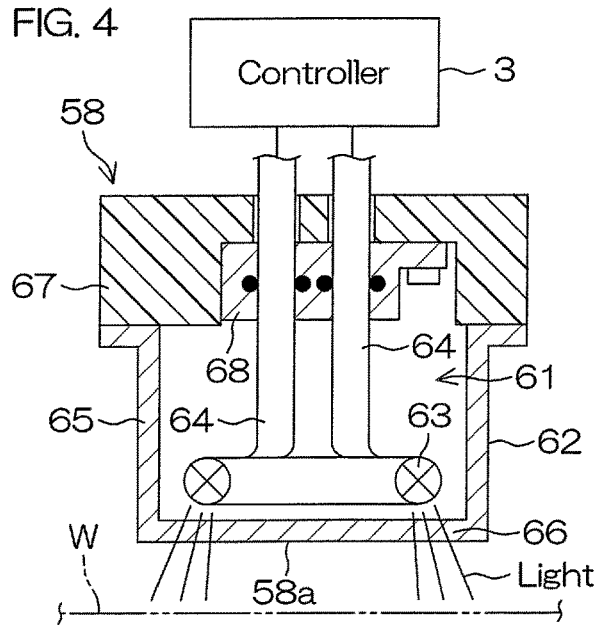
FIG. 4 is a vertical sectional view of an infrared heater.

FIG. 1 is a schematic plan view of a substrate processing apparatus 1 according to a first embodiment of the present invention. FIG. 2 is a horizontally-viewed schematic view of the interior of a chamber 4 included in the substrate processing apparatus 1 according to the first embodiment of the present invention. FIG. 3 is a schematic plan view of a spin base 7 and an arrangement related thereto. FIG. 4 is a vertical sectional view of an infrared heater 58.

As shown in FIG. 1, the substrate processing apparatus 1 is a single substrate processing type apparatus that processes a disk-shaped substrate W, such as a semiconductor wafer, etc., one by one. The substrate processing apparatus 1 includes a plurality of processing units 2, each processing the substrate W using processing liquids and processing gases, a substrate transfer robot CR performing carrying-in and carrying-out of the substrate W with respect to the chamber 4 of each processing unit 2, and a controller 3 controlling operations of apparatuses and opening and closing of valves provided in the substrate processing apparatus 1.

As shown in FIG. 2, each processing unit 2 is a single substrate processing type unit. Each processing unit 2 includes the box-shaped chamber 4 that has an internal space, a spin chuck 5 holding a single substrate W in a horizontal attitude inside the chamber 4 and rotating the substrate W around a vertical substrate rotation axis A1 passing through the center of the substrate W, a processing liquid supplying apparatus supplying a processing liquid, such as a chemical solution, a rinse liquid, etc., to the substrate W held by the spin chuck 5, a heating apparatus heating the substrate W, held by the spin chuck 5, from above the substrate W, and a cylindrical cup 6 surrounding a periphery of the spin chuck 5 around the substrate rotation axis A1.

As shown in FIG. 2, the spin chuck 5 includes a disk-shaped spin base 7 that is held in a horizontal attitude, a plurality of chuck pins 8 projecting upward from upper surface outer peripheral portions of the spin base 7, and an unillustrated chuck opening/closing mechanism that opens and closes the plurality of chuck pins 8. The spin chuck 5 further includes a spin shaft 9 extending downward along the substrate rotation axis A1 from a central portion of the spin base 7, and a spin motor 10 rotating the spin shaft 9 to rotate the spin base 7 and the chuck pins 8 around the substrate rotation axis A1.

As shown in FIG. 3, the outer diameter of the spin base 7 is greater than the diameter of the substrate W. The center line of the spin base 7 is disposed along the substrate rotation axis A1. The plurality of chuck pins 8 are held by the spin base 7 at the outer peripheral portions of the spin base 7. The plurality of chuck pins are disposed at intervals in the circumferential direction (direction around the substrate rotation axis A1). Each chuck pin 8 is capable of rotating around a vertical pin rotation axis with respect to the spin base 7 between a closed position (position shown in FIG. 2 and FIG. 3) at which the chuck pin 8 is pressed against a peripheral end surface of the substrate W and an open position at which the chuck pin 8 is separated from the peripheral end surface of the substrate W. The chuck opening/closing mechanism makes the chuck pins 8 rotate around the pin rotation axes.

The controller 3 controls the chuck opening/closing mechanism to switch the state of the plurality of chuck pins 8 between the closed state (state shown in FIG. 2 and FIG. 3) in which the plurality of chuck pins 8 grip the substrate W and the open state in which the gripping of the substrate W by the plurality of chuck pins 8 is released. When the substrate W is transferred to the spin chuck 5, the controller 3 makes the respective chuck pins 8 retract to the open positions. In this state, the controller 3 makes the substrate transfer robot CR place the substrate W on the plurality of chuck pins 8. Thereafter, the controller 3 makes the respective chuck pins 8 move to the closed positions. The substrate W is thereby gripped by the plurality of chuck pins 8 in a state where a lower surface of the substrate W and an upper surface of the spin base 7 are separated in an up/down direction. When the controller 3 makes the spin motor 10 rotate in this state, the substrate W rotates around the substrate rotation axis A1 together with the spin base 7 and the chuck pins 8.

As shown in FIG. 2, the processing liquid supplying apparatus includes a first chemical solution nozzle 11 that discharges a chemical solution, such as an SPM (a mixed solution containing $H_2SO_4$ and $H_2O_2$), which is an example of a resist stripping solution, etc., toward an upper surface of the substrate W, a first nozzle arm 12 having the first chemical solution nozzle 11 mounted at a tip portion, and a first nozzle moving apparatus 13 that moves the first nozzle arm 12 to move the first chemical solution nozzle 11.

As shown in FIG. 3, the first nozzle moving apparatus 13 rotates the first nozzle arm 12 around a first nozzle rotation axis A2 extending in a vertical direction at a periphery of the spin chuck 5 to make the first chemical solution nozzle 11 move horizontally along a locus passing through an upper surface central portion of the substrate W in a plan view. The first nozzle moving apparatus 13 makes the first chemical solution nozzle 11 move horizontally between a processing position at which the chemical solution discharged from the first chemical solution nozzle 11 lands on the upper surface of the substrate W and a retracted position (position shown in FIG. 3) at which the first chemical solution nozzle 11 is retracted to the periphery of the spin chuck 5 in a plan view.

As shown in FIG. 2, the processing liquid supplying apparatus includes a first chemical solution piping 14 guiding the SPM or other chemical solution to the first chemical solution nozzle 11, a stirring piping stirring the sulfuric acid and the hydrogen peroxide solution guided to the first chemical solution nozzle 11 by the first chemical solution piping 14, and a mixing valve 16 mixing the sulfuric acid and the hydrogen peroxide solution supplied to the first chemical solution piping 14 at an upstream side of the stirring piping 15.

As shown in FIG. 2, the processing liquid supplying apparatus includes a sulfuric acid tank 17 containing the sulfuric acid (liquid), a first heater 21 heating the sulfuric acid to maintain the temperature of the sulfuric acid inside the sulfuric acid tank 17 at a temperature (a fixed temperature in a range of 60 to 90° C., for example, 80° C.) higher than room temperature, a sulfuric acid piping 18 guiding the sulfuric acid inside the sulfuric acid tank 17 to the mixing valve 16, a sulfuric acid valve 19 opening and closing the interior of the sulfuric acid piping 18, and a sulfuric acid flow control valve 20 increasing and decreasing the flow rate of the sulfuric acid supplied from the sulfuric acid piping 18 to the mixing valve 16. Although not illustrated, the sulfuric acid flow control valve 20 includes a valve body having a valve seat provided in the interior, a valve element opening and closing the valve seat, and an actuator that moves the valve element between an open position and a closed position. The same applies to other flow control valves. As shown in FIG. 2, the processing liquid supplying apparatus includes a hydrogen peroxide solution tank 22 containing the hydrogen peroxide solution, a hydrogen peroxide solution piping 23 guiding the hydrogen peroxide solution of room temperature (a fixed temperature in a range of 20° C. to 30° C., for example, 25° C.) inside the hydrogen peroxide solution tank 22 to the mixing valve 16, a hydrogen peroxide solution valve 24 opening and closing the interior of the hydrogen peroxide solution piping 23, and a hydrogen peroxide solution flow control valve 25 increasing and decreasing the flow rate of the hydrogen peroxide solution supplied from the hydrogen peroxide solution piping 23 to the mixing valve 16.

When the sulfuric acid valve 19 is opened, the high-temperature sulfuric acid is supplied from the sulfuric acid piping 18 to the mixing valve 16 at a flow rate corresponding to the opening degree of the sulfuric acid flow control valve 20. Also, when the hydrogen peroxide solution valve 24 is opened, the room-temperature hydrogen peroxide solution inside the hydrogen peroxide solution tank 22 is supplied from the hydrogen peroxide solution piping 23 to the mixing valve 16 at a flow rate corresponding to the opening degree of the hydrogen peroxide solution flow control valve 25. The sulfuric acid and the hydrogen peroxide solution are thereby supplied to the mixing valve 16 at predetermined proportions (if "X1" is the proportion of sulfuric acid and "Y1" is the proportion of hydrogen peroxide solution, for example, X1>Y1).

The sulfuric acid and the hydrogen peroxide solution supplied to the mixing valve 16 are supplied from the first chemical solution piping 14 to the first chemical solution nozzle 11 via the mixing piping 15. In this process, the sulfuric acid and the hydrogen peroxide solution are mixed at the mixing valve 16 and stirred at the stirring piping 15. The sulfuric acid and the hydrogen peroxide solution are thereby mixed uniformly, and the mixed solution (SPM) of the sulfuric acid and the hydrogen peroxide solution is heated by the reaction of the sulfuric acid and the hydrogen peroxide solution to a temperature (for example, of no less than 100° C.) that is higher than the temperatures of the sulfuric acid and the hydrogen peroxide solution before mixing. The SPM of high temperature that is formed by the mixing of the sulfuric acid and the hydrogen peroxide solution is thus discharged from the first chemical solution nozzle 11. The SPM is a mixed chemical solution that contains peroxomonosulfuric acid, which has a high oxidizing power.

As shown in FIG. 2, the processing liquid supplying apparatus includes a second chemical solution nozzle 29 discharging a chemical solution, such as SC1 (a mixed solution containing $NH_4OH$ and $H_2O_2$), etc., toward the upper surface of the substrate W, a second nozzle arm 30 having the second chemical solution nozzle 29 mounted at a tip portion, and a second nozzle moving apparatus 31 moving the second nozzle arm 30 to move the second chemical solution nozzle 29.

As shown in FIG. 3, the second nozzle moving apparatus 31 rotates the second nozzle arm 30 around a second nozzle rotation axis A3 extending in the vertical direction at a periphery of the spin chuck 5 to make the second chemical solution nozzle 29 move horizontally along a locus passing through the upper surface central portion of the substrate W in a plan view. The second nozzle moving apparatus 31 makes the second chemical solution nozzle 29 move horizontally between a processing position at which the chemical solution discharged from the second chemical solution nozzle 29 lands on the upper surface of the substrate W and a retracted position at which the second chemical solution nozzle 29 is retracted to the periphery of the spin chuck 5 in a plan view.

As shown in FIG. 2, the processing liquid supplying apparatus includes a second chemical solution piping 33 guiding the SC1 of a temperature (for example, 30 to 50° C.) that is lower than the temperature of the SPM and higher than room temperature to the second chemical solution nozzle 29 and a second chemical solution valve 34 opening and closing the interior of the second chemical solution piping 33. When the second chemical solution valve 34 is opened, the SC1 from a second chemical solution supply source is supplied from the second chemical solution piping 33 to the second chemical solution nozzle 29. The SC1 (liquid) of, for example, 40° C. is thereby discharged from the second chemical solution nozzle 29.

As shown in FIG. 2, the processing liquid supplying apparatus includes a first rinse liquid nozzle 36 discharging a rinse liquid toward the upper surface of the substrate W, a second rinse liquid nozzle 37 discharging a rinse liquid toward the upper surface of the substrate W, a third nozzle arm 38 having the first rinse liquid nozzle 36 and the second rinse liquid nozzle 37 mounted at tip portions, and a third nozzle moving apparatus 39 that moves the third nozzle arm 37 to move the first rinse liquid nozzle 36 and the second rinse liquid nozzle 37.

Although not illustrated, the third nozzle moving apparatus 39 rotates the third nozzle arm 38 around a third nozzle rotation axis extending in the vertical direction at a periphery of the spin chuck 5 to make the first rinse liquid nozzle 36 and the second rinse liquid nozzle 37 move horizontally along a locus passing through the upper surface central portion of the substrate W in a plan view. The third nozzle moving apparatus 39 makes the first rinse liquid nozzle 36 and the second rinse liquid nozzle 37 move horizontally between a processing position at which the rinse liquid discharged from the first rinse liquid nozzle 36 and the second rinse liquid nozzle 37 lands on the upper surface of the substrate W and a retracted position at which the first rinse liquid nozzle 36 and the second rinse liquid nozzle 37 are retracted to the periphery of the spin chuck 5 in a plan view.

As shown in FIG. 2, the processing liquid supplying apparatus includes a first rinse liquid piping 40 that guides the rinse liquid from a rinse liquid supply source to the first rinse liquid nozzle 36 and a first rinse liquid valve 41 opening and closing the interior of the first rinse liquid piping 40. The processing liquid supplying apparatus further includes a second rinse liquid piping 42 that guides the rinse liquid from a rinse liquid supply source to the second rinse liquid nozzle 37 and a second rinse liquid valve 43 opening and closing the interior of the second rinse liquid piping 42.

When the first rinse liquid valve 41 is opened, the rinse liquid of room temperature (for example, 25° C.) is discharged from the first rinse liquid nozzle 36. Similarly, when the second rinse liquid valve 43 is opened, the rinse liquid of room temperature (for example, 25° C.) is discharged from the second rinse liquid nozzle 37. The rinse liquid supplied to the first rinse liquid nozzle 36 is pure water (deionized water). The rinse liquid supplied to the second rinse liquid nozzle 37 is carbonated water.

The rinse liquids supplied to the first rinse liquid nozzle 36 and the second rinse liquid nozzle 37 are not restricted to pure water or carbonated water and may instead be electrolyzed ion water, hydrogen water, ozone water, IPA (isopropyl alcohol), or aqueous hydrochloric acid solution of dilute concentration (for example, approximately 10 to 100 ppm), etc. Each of carbonated water, electrolyzed ion water, hydrogen water, ozone water, IPA, and aqueous hydrochloric acid solution of dilute concentration is also an example of an antistatic liquid that is higher in specific resistance than SPM and conducts electricity.

As shown in FIG. 2, the cup 6 is disposed further outward than the substrate W held by the spin chuck 5. The cup 6 surrounds the spin base 7. When a processing liquid is supplied to the substrate W in a state where the spin chuck 5 is rotating the substrate W, the processing liquid splashes from the substrate W to a periphery of substrate W. When the processing liquid is supplied to the substrate W, an upper end portion of the upwardly open cup 6 is disposed higher than the spin base 7. The processing liquid, such as the chemical solution, the rinse liquid, etc., that is expelled to the periphery of the substrate W is thus received by the cup 6. The processing liquid received by the cup 6 is fed to an unillustrated recovery apparatus or drain apparatus.

As shown in FIG. 2, the heating apparatus includes an infrared heater 58 disposed above the substrate W held by the spin chuck 5, a heater arm 59 having the infrared heater 58 mounted at a tip portion, and a heater moving apparatus 60 that moves the heater arm 59 to move the infrared heater 58.

As shown in FIG. 2, the infrared heater 58 includes an infrared lamp 61 emitting light that includes infrared rays and a lamp housing 62 housing the infrared lamp 61. The infrared lamp 61 is disposed inside the lamp housing 62. As shown in FIG. 3, the lamp housing 62 is smaller than the substrate W in a plan view. The infrared heater 58 is thus smaller than the substrate W in a plan view. The infrared lamp 61 and the lamp housing 62 are mounted on the heater arm 59. The infrared lamp 61 and the lamp housing 62 thus move together with the heater arm 59.

As shown in FIG. 4, the infrared lamp 61 is connected to the controller 3. The electric power supplied to the infrared lamp 61 is adjusted by the controller 3. The infrared lamp 61 is, for example, a halogen lamp. Instead of a halogen lamp, the infrared lamp 61 may be another heat generating element, such as a carbon heater, etc. The infrared lamp 61 includes a filament and a quartz tube housing the filament. At least a portion of the lamp housing 62 is made of quartz or other material with light transmitting property and heat resistance. Therefore, when the infrared lamp 61 emits light, the light from the infrared lamp 61 is transmitted through the lamp housing 62 and is radiated outward from the outer surface of the lamp housing 62.

As shown in FIG. 4, the lamp housing 62 has a bottom wall that is parallel to the upper surface of the substrate W. The infrared lamp 61 is disposed above the bottom wall. A lower surface of the bottom wall includes a substrate facing surface 58a that is parallel to the upper surface of the substrate W and is flat. In a state where the infrared heater 58 is disposed above the substrate W, the substrate facing surface 58a of the infrared heater 58 faces the upper surface of the substrate W in the up/down direction across an interval. When the infrared lamp 61 emits light in this state, the light including the infrared rays is directed from the substrate facing surface 58a toward the upper surface of the substrate W and is irradiated on the upper surface of the substrate W. The substrate facing surface 58a has, for example, a circular shape with a diameter smaller than the radius of the substrate W. The substrate facing surface 58a is not restricted to having a circular shape and may have a rectangular shape with the length in the longitudinal direction being no less than the radius of the substrate W and less than the diameter of the substrate W or may have a shape other than a circular shape or a rectangular shape.

As shown in FIG. 4, the infrared lamp 61 includes an annular portion 63 with ends that is disposed along a horizontal plane and a pair of vertical portions 64 extending upward from one end portion and another end portion of the annular portion 63. The lamp housing 62 includes a transmitting member that allows transmission of infrared rays. The transmitting member includes a cylindrical housing portion 65 that extends in the up/down direction and a disk-shaped bottom plate portion 66 that closes a lower end of the housing portion 65. The lamp housing 62 further includes a lid member 67 closing an upper end of the housing portion 65 and a supporting member 68 supporting the pair of vertical portions 64 of the infrared lamp 61. The infrared lamp 61 is supported by the lid member 67 via the supporting member 68. The annular portion 63 of the infrared lamp 61 is disposed in a space demarcated by the housing portion 65, the bottom plate portion 66, and the lid member 67. The bottom plate portion 66 is disposed below the infrared lamp 61 and faces the infrared lamp 61 in the up/down direction across an interval.

As shown in FIG. 2, the heater moving apparatus 60 holds the infrared heater 58 at a predetermined height. As shown in FIG. 3, the heater moving apparatus 60 rotates the heater arm 59 around a heater rotation axis A4 extending in a vertical direction at a periphery of the spin chuck 5 to move the infrared heater 58 horizontally. The irradiation position onto which the infrared rays are irradiated (a region of a portion within the upper surface of the substrate W) is thereby moved within the upper surface of the substrate W. The heater moving apparatus moves the infrared heater 58 along a locus passing through the center of the substrate W in a plan view. The infrared heater 58 thus moves within a horizontal plane that includes a portion above the spin chuck 5. Also, the heater moving apparatus 60 moves the infrared heater 58 in the vertical direction to change the distance between the substrate facing surface 58a and the substrate W.

As shown in FIG. 4, the light from the infrared heater 58 is irradiated onto the irradiation position within the upper surface of the substrate W. In the state where the infrared heater 58 is emitting infrared rays, the controller 3 makes the infrared heater 58 rotate around the heater rotation axis A4 by means of the heater moving apparatus 60 while making the substrate W rotate by means of the spin chuck 5. The upper surface of the substrate W is thereby scanned by the irradiation position as a heating position. Therefore, when the infrared lamp 61 emits infrared rays in the state where a liquid, such as a processing liquid, etc., is held on the substrate W, the temperatures of the substrate W and the processing liquid rise.

Figure 5:
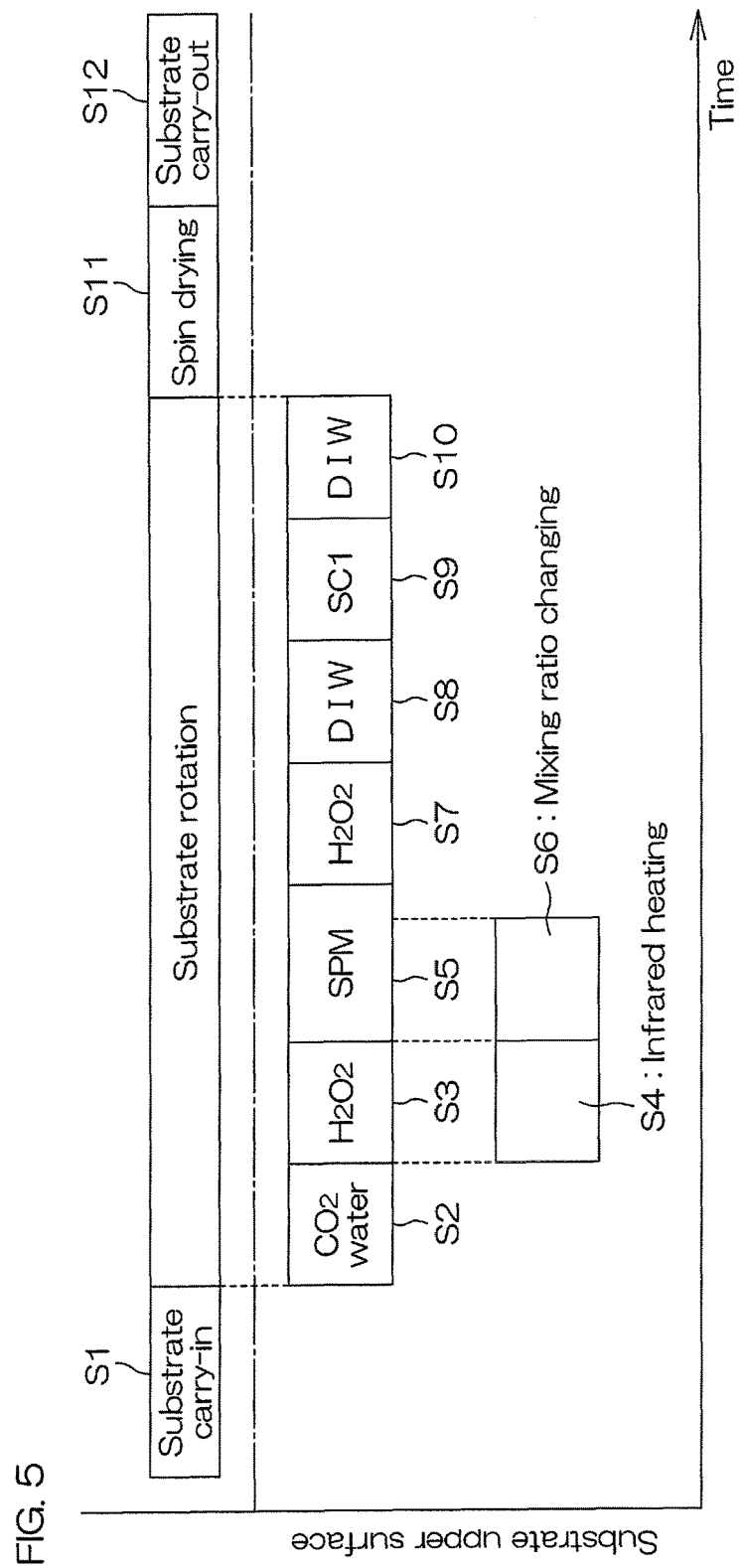
FIG. 5 is an outline time chart of a process example performed by a processing unit.
Figure 6:
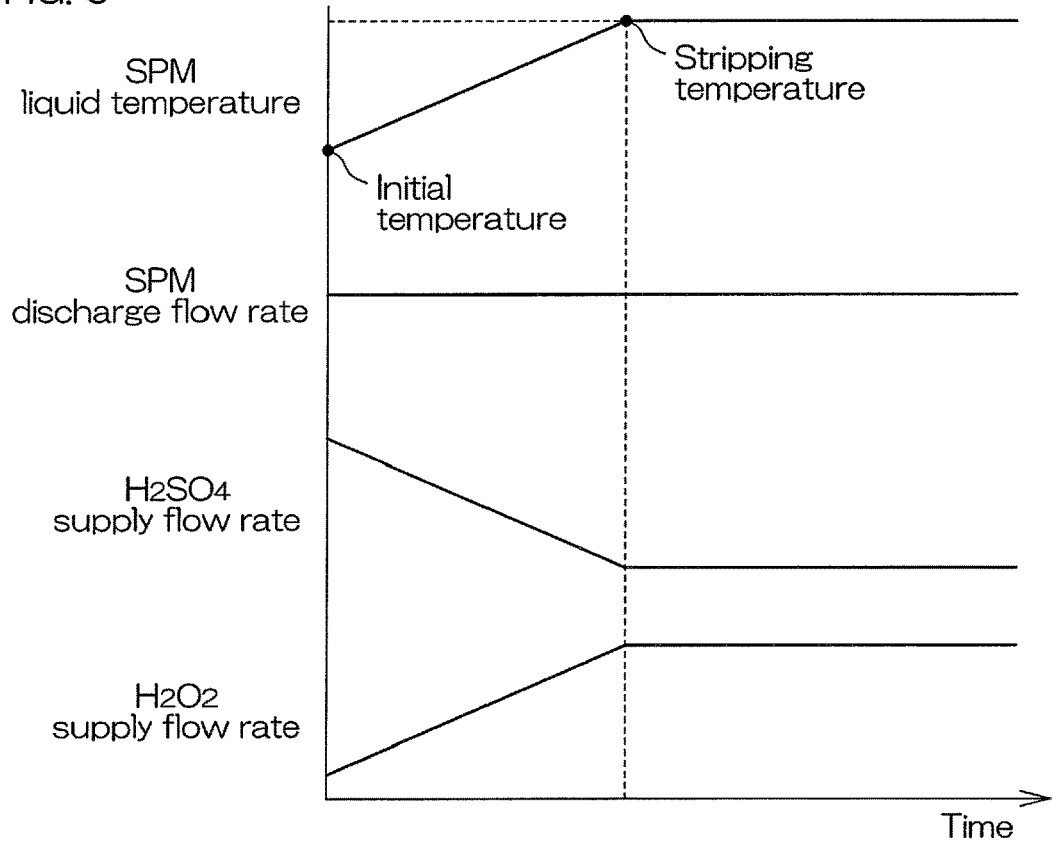
FIG. 6 is a graph of a change of liquid temperature of an SPM supplied to the substrate.
Figure 7:
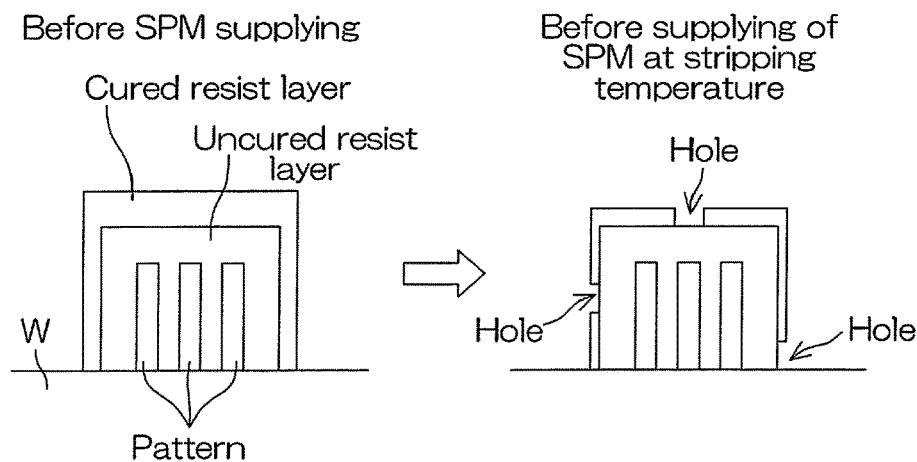
FIG. 7 is a schematic view of a state of the substrate before the liquid temperature of the SPM supplied to the substrate reaches a stripping temperature.

FIG. 5 is an outline time chart of a process example performed by the processing unit 2. FIG. 6 is a graph of a change of liquid temperature of the SPM supplied to the substrate W. FIG. 7 is a schematic view of a state of the substrate W before the liquid temperature of the SPM supplied to the substrate W reaches a stripping temperature. In the following description, a resist stripping process of removing a resist (photoresist thin film), including a cured layer positioned at a surface layer and an uncured layer covered by the cured layer, from the substrate W, with which the front surface (device forming surface) is partially covered by the resist and an entirety of a pattern formed on the front surface is disposed in the interior of the resist as shown in FIG. 7, shall be described. In the following description, FIG. 2 and FIG. 5 shall mainly be referenced. FIG. 6 and FIG. 7 shall be referenced where necessary.

When the substrate W is to be processed by the processing unit 2, a carrying-in step (step S1 of FIG. 5) of carrying the substrate W into the chamber 4 is performed. Specifically, in a state where all of the nozzles, etc., are retracted from above the spin chuck 5, the controller 3 makes the hand of the transfer robot CR that holds the substrate W enter inside the chamber 4. The controller 3 then makes the transfer robot CR place the substrate W on the plurality of chuck pins 8. Thereafter, the controller 3 makes the hand of the transfer robot CR retract from inside the chamber 4. Also, after the substrate W has been placed on the plurality of chuck pins 8, the controller 3 makes the respective chuck pins 8 move from the open positions to the closed positions. Thereafter the controller 3 starts the rotation of the substrate W by the spin motor 10.

Thereafter, an antistatic liquid supplying step (step S2 of FIG. 5) of supplying the carbonated water, which is an example of an antistatic liquid, to the substrate W is performed. Specifically, the controller 3 controls the third nozzle moving apparatus 39 to make the second rinse liquid nozzle 37 as the antistatic liquid nozzle move from the retracted position to the processing position. Thereafter, the controller 3 opens the second rinse liquid valve 43 to make the second rinse liquid nozzle 37 discharge the carbonated water of room temperature toward the upper surface central portion of the substrate W. When a predetermined time elapses from the opening of the second rinse liquid valve 43, the controller 3 closes the second rinse liquid valve 43 to stop the discharge of carbonated water from the second rinse liquid nozzle 37. Thereafter, the controller 3 controls the third nozzle moving apparatus 39 to make the second rinse liquid nozzle 37 retract from above the substrate W.

The carbonated water discharged from the second rinse liquid nozzle 37 lands on the upper surface of the substrate W and thereafter flows outward along the upper surface of the substrate W due to a centrifugal force. The carbonated water is thus supplied to the entirety of the upper surface of the substrate W and a liquid film of carbonated water that covers the entire upper surface of the substrate W is thereby formed on the substrate W. Therefore, if the substrate W is charged, the charges move from the substrate W to the carbonated water and the charges are removed from the substrate W. In particular, the specific resistance of the carbonated water is greater than the specific resistance of the SPM and therefore the charges move slowly from the substrate W to the carbonated water. Damaging of a device formed on the substrate W due to heat generation or discharge caused by rapid movement of charges can thus be prevented.

When the second rinse liquid nozzle 37 is discharging the carbonated water, the controller 3 may keep the liquid landing position of the carbonated water with respect to the upper surface of the substrate W still at the central portion or may move it between the central portion and a peripheral edge portion. Also, after the carbonated water liquid film has been formed on the substrate W, the controller 3 may stop the discharge of the carbonated water from the second rinse liquid nozzle 37 at the same time as rotating the substrate W at a low rotation speed (for example, 1 to 30 rpm) or stopping the rotation of the substrate W to make the carbonated water liquid film, covering the entire upper surface of the substrate W, be held on the substrate W.

Thereafter, a first hydrogen peroxide solution supplying step (step S3 of FIG. 5) of supplying the hydrogen peroxide solution of room temperature to the substrate W and a heating step (step S4 of FIG. 5) of heating the substrate W and the liquid on the substrate W by the infrared heater 58 are performed in parallel.

In regard to the first hydrogen peroxide solution supplying step, the controller 3 controls the first nozzle moving apparatus 13 to make the first chemical solution nozzle 11 move from the retracted position to the processing position. The first chemical solution nozzle 11 is thereby positioned above the substrate W. Thereafter, the controller 3 opens the hydrogen peroxide solution valve 24 in the state where the sulfuric acid valve 19 is closed to make the first chemical solution nozzle 11 discharge the hydrogen peroxide solution of room temperature toward the upper surface central portion of the rotating substrate W. When the first chemical solution nozzle 11 is discharging the hydrogen peroxide solution, the controller 3 may keep the liquid landing position of the hydrogen peroxide solution with respect to the upper surface of the substrate W still at the central portion or may move it between the central portion and a peripheral edge portion.

The hydrogen peroxide solution discharged from the first chemical solution nozzle 11 lands on the upper surface central portion of the substrate W that is covered by the carbonated water. The carbonated water on the substrate W is thus forced to flow away from the central portion to a periphery thereof. The hydrogen peroxide solution that has landed on the upper surface central portion of the substrate W flows outward along the upper surface of the substrate W due to the centrifugal force. Similarly, the carbonated water on the substrate W flows outward along the upper surface of the substrate W due to the centrifugal force. A liquid film of hydrogen peroxide solution of circular shape in a plan view thus spreads instantly from the central portion of the substrate W to the peripheral edge of the substrate W and the carbonated water on the substrate W is replaced by the hydrogen peroxide solution in a short time. The carbonated water is thereby eliminated from the substrate W.

In regard to the heating step, the controller 3 controls the heater moving apparatus 60 to move the infrared heater 58 from the retracted position to the processing position. Also, before or after the infrared heater 58 moves to a position above the substrate W, the controller 3 makes the infrared heater 58 start emitting light. The temperature of the infrared heater 58 thus rises to the heating temperature (for example, no less than 120° C.) that is no less than the liquid temperature of the SPM when the supply of the SPM to the substrate W is started and is maintained at the heating temperature. Thereafter, the controller 3 makes the infrared heater 58 move by means of the heater moving apparatus 60 to make the position of irradiation of the infrared rays with respect to the upper surface of the substrate W move within the upper surface of the substrate W. The temperatures of the substrate W and the liquid on the substrate W are thereby made to approach the heating temperature. After the heating of the substrate W by the infrared heater 58 has been performed for a predetermined time, the controller 3 makes the infrared heater 58 stop emitting light. Thereafter, the controller 3 controls the heater moving apparatus 60 to retract the infrared heater 58 from above the substrate W.

Thereafter, an SPM supplying step (step S5 of FIG. 5) of supplying the SPM, which is an example of a resist stripping solution, to the substrate W and a liquid temperature increasing step (step S6 of FIG. 5) of changing a mixing ratio of the sulfuric acid and the hydrogen peroxide solution used to form the SPM to increase the liquid temperature of the SPM supplied to the substrate W are performed in parallel.

In regard to the SPM supplying step, after the emission of light by the infrared heater 58 is stopped, the controller 3 opens the sulfuric acid valve 19 while the first chemical solution nozzle 11 is discharging the hydrogen peroxide solution above the substrate W. The sulfuric acid and the hydrogen peroxide solution are thereby mixed at a predetermined mixing ratio to form the SPM. The SPM of an initial temperature (for example, 50° C.) that is higher than the temperatures of the sulfuric acid and the hydrogen peroxide solution before mixing is thus discharged from the first chemical solution nozzle 11 toward the upper surface of the rotating substrate W. When the first chemical solution nozzle 11 is discharging the SPM, the controller 3 may keep the liquid landing position of the SPM with respect to the upper surface of the substrate W still at the central portion or may move it between the central portion and a peripheral edge portion.

In regard to the liquid temperature increasing step, as shown in FIG. 6, the controller 3 changes the opening degree of at least one of the sulfuric acid flow control valve 20 and the hydrogen peroxide solution flow control valve 25 to gradually change the mixing ratio of the sulfuric acid and the hydrogen peroxide solution continuously or stepwise from an initial mixing ratio to a stripping mixing ratio so that the proportion of the sulfuric acid with respect to the hydrogen peroxide solution decreases gradually while the discharge flow rate of the SPM from the first chemical solution nozzle 11 is maintained fixed. Specifically, the controller 3 decreases the flow rate of the sulfuric acid that is mixed with the hydrogen peroxide solution and increases the flow rate of the hydrogen peroxide solution that is mixed with the sulfuric acid. The amount of heat generated by the mixing of the sulfuric acid and the hydrogen peroxide solution is thereby increased and the liquid temperature of the SPM increases gradually. The SPM of the stripping temperature (for example, 160° C.) that is higher than the initial temperature is thus formed and discharged from the first chemical solution nozzle 11.

The SPM discharged from the first chemical solution nozzle 11 lands on the upper surface of the substrate W and thereafter flows outward along the upper surface of the substrate W due to the centrifugal force. The SPM is thus supplied to the entire upper surface of the substrate W and the hydrogen peroxide solution on the substrate W is replaced by the SPM. An SPM liquid film covering the entire upper surface of the substrate W is thus formed on the substrate W. The SPM prior to reaching the stripping temperature reacts chemically with the resist on the substrate W. Holes are thereby opened in the cured layer of the resist to expose the uncured layer of the resist from the cured layer as shown in FIG. 7. Therefore, even if the liquid temperature of the SPM increases from the initial temperature to the stripping temperature and the uncured layer of the resist expands due to vaporization, etc., the resist components move outside the cured layer through the holes in the cured layer. Pattern damage due to popping of the cured layer can thus be prevented. Further, the SPM rises in liquid temperature from the initial temperature to the stripping temperature to be increased in resist peeling ability and therefore the resist with the cured surface layer can be removed reliably. The resist can thereby be removed while preventing pattern damage.

Thereafter, a second hydrogen peroxide solution supplying step (step S7 of FIG. 5) of supplying the hydrogen peroxide solution of room temperature to the substrate W is performed. Specifically, in the state where the first chemical solution nozzle 11 is discharging the SPM above the substrate W, that is, in the state where the sulfuric acid valve 19 and the hydrogen peroxide solution valve 24 are open, the controller 3 closes the sulfuric acid valve 19. The supply of the sulfuric acid to the first chemical solution nozzle 11 is thereby stopped and just the hydrogen peroxide solution of room temperature is discharged from the first chemical solution nozzle 11 to the upper surface of the rotating substrate W. When the first chemical solution nozzle 11 is discharging the hydrogen peroxide solution, the controller 3 may keep the liquid landing position of the hydrogen peroxide solution with respect to the upper surface of the substrate W still at the central portion or may move it between the central portion and a peripheral edge portion.

The hydrogen peroxide solution discharged from the first chemical solution nozzle 11 lands on the upper surface central portion of the substrate W that is covered by the SPM. The SPM on the substrate W is thus forced to flow away from the central portion to the periphery thereof. The hydrogen peroxide solution that has landed on the upper surface central portion of the substrate W flows outward along the upper surface of the substrate W due to the centrifugal force. Similarly, the SPM on the substrate W flows outward along the upper surface of the substrate W due to the centrifugal force. A liquid film of hydrogen peroxide solution of circular shape in a plan view thus spreads instantly from the central portion of the substrate W to the peripheral edge of the substrate W and the SPM on the substrate W is replaced by the hydrogen peroxide solution in a short time. The SPM is thereby eliminated from the substrate W.

Thereafter, a first rinse liquid supplying step (step S8 of FIG. 5) of supplying pure water of room temperature, which is an example of a rinse liquid, to the substrate W is performed. Specifically, the controller 3 controls the third nozzle moving apparatus 39 to move the first rinse liquid nozzle 36 from the retracted position to the processing position. Thereafter, the controller 3 opens the first rinse liquid valve 41 to make the pure water of room temperature be discharged from the first rinse liquid nozzle 36 toward the upper surface central portion of the substrate W. When a predetermined time has elapsed from the opening of the first rinse liquid valve 41, the controller 3 closes the first rinse liquid valve to stop the discharge of pure water from the first rinse liquid nozzle 36. Thereafter, the controller 3 controls the third nozzle moving apparatus 39 to make the first rinse liquid nozzle 36 retract from above the substrate W.

The pure water discharged from the first rinse liquid nozzle 36 lands on the upper surface central portion of the substrate W that is covered by the chemical solution. The chemical solution on the substrate W is thus forced to flow away from the central portion to the periphery thereof. The pure water that has landed on the upper surface central portion of the substrate W flows outward along the upper surface of the substrate W due to the centrifugal force. Similarly, the chemical solution on the substrate W flows outward along the upper surface of the substrate W due to the centrifugal force. A liquid film of pure water of circular shape in a plan view thus spreads instantly from the central portion of the substrate W to the peripheral edge of the substrate W and the chemical solution on the substrate W is replaced by the pure water in a short time. The chemical solution on the substrate W is thereby rinsed off by the pure water.

Thereafter, an SC1 supplying step (step S9 of FIG. 5) of supplying the SC1 to the substrate W is performed. Specifically, the controller 3 controls the second nozzle moving apparatus 31 to move the second chemical solution nozzle 29 from the retracted position to the processing position. After the second chemical solution nozzle 29 has been positioned above the substrate W, the controller 3 opens the second chemical solution valve 34 to make the SC1 be discharged from the second chemical solution nozzle 29 toward the upper surface of the rotating substrate W. In this state, the controller 3 controls the second nozzle moving apparatus 31 to make the liquid landing position of the SC1 with respect to the upper surface of the substrate W move between the central portion and the peripheral edge portion. When a predetermined time elapses from the opening of the second chemical solution valve 34, the controller 3 closes the second chemical solution valve 34 to stop the discharge of the SC1. Thereafter, the controller 3 controls the second nozzle moving apparatus 31 to make the second chemical solution nozzle 29 retract from above the substrate W.

The SC1 discharged from the second chemical solution nozzle 29 lands on the upper surface of the substrate W and thereafter flows outward along the upper surface of the substrate W due to the centrifugal force. The pure water on the substrate W is thus forced to flow outward by the SC1 and is expelled to the periphery of the substrate W. The liquid film of pure water on the substrate W is thereby replaced by a liquid film of SC1 that covers the entire upper surface of the substrate W. Further, the controller 3 makes the liquid landing position of the SC1 with respect to the upper surface of the substrate W move between the central portion and the peripheral edge portion in the state where the substrate W is rotating so that the liquid landing position of the SC1 passes through the entire upper surface of the substrate W and the entire upper surface of the substrate W is scanned. The SC1 discharged from the second chemical solution nozzle 29 is thus supplied to the entire upper surface of the substrate W and the entire upper surface of the substrate W is processed uniformly.

Thereafter, a second rinse liquid supplying step (step S10 of FIG. 5) of supplying pure water of room temperature, which is an example of the rinse liquid, to the substrate W is performed. Specifically, the controller 3 controls the third nozzle moving apparatus 38 to move the rinse liquid nozzle 36 from the retracted position to the processing position. After the rinse liquid nozzle 36 has been positioned above the substrate W, the controller 3 opens the first rinse liquid valve 41 to make the pure water be discharged from the rinse liquid nozzle 36 toward the upper surface of the substrate W in the rotating state. The SC1 on the substrate W is thereby forced to flow outward by the pure water and is expelled to the periphery of the substrate W. The liquid film of SC1 on the substrate W is thus replaced by a liquid film of pure water that covers the entire upper surface of the substrate W. When a predetermined time elapses from the opening of the first rinse liquid valve 41, the controller closes the first rinse liquid valve 41 to stop the discharge of pure water. Thereafter, the controller 3 controls the first nozzle moving apparatus 13 to make the rinse liquid nozzle 36 retract from above the substrate W.

Thereafter, a drying step (step S11 of FIG. 5) of drying the substrate W is performed. Specifically, the controller 3 controls the spin motor 10 to accelerate the substrate W to a drying rotation speed (for example of several thousand rpm) that is greater than the rotation speed in the antistatic liquid supplying step (step S2 of FIG. 5) to the second rinse liquid supplying step (step S10 of FIG. 5) and makes the substrate W rotate at the drying rotation speed. A large centrifugal force is thereby applied to the liquid on the substrate W and the liquid attached to the substrate W is spun off to the periphery of the substrate W. The substrate W is thereby removed of liquid and the substrate W dries. After a predetermined time elapses from the start of high-speed rotation of the substrate W, the controller 3 controls the spin motor 10 to stop the rotation of the substrate W by the spin chuck 5.

Thereafter, a carrying-out step (step S12 of FIG. 5) of carrying out the substrate W from inside the chamber 4 is performed. Specifically, the controller 3 moves the respective chuck pins 8 from the closed positions to the open positions to release the gripping of the substrate W by the spin chuck 5. Thereafter, in the state where all nozzles, etc., are retracted from above the spin chuck 5, the controller 3 makes the hand of the substrate transfer robot CR enter inside the chamber 4. The controller 3 then makes the hand of the transfer robot CR hold the substrate W on the spin chuck 5. Thereafter, the controller 3 makes the hand of the substrate transfer robot CR retract from inside the chamber 4. The processed substrate W is thereby carried out of the chamber 4.

As described above, with the first embodiment, the SPM is formed by mixing the sulfuric acid and the hydrogen peroxide solution. The SPM thus formed is supplied to the substrate W that is covered by the resist. The surface layer of the resist is cured by alteration by ion implantation or dry etching and the interior of the resist is sealed by the cured layer positioned at the surface layer. The mixing ratio of the sulfuric acid and the hydrogen peroxide solution used to form the SPM is changed when the SPM is being supplied to the substrate W and the liquid temperature of the SPM supplied to the substrate W is thereby increased to the stripping temperature suited for stripping the resist. The cured layer positioned at the surface layer of the resist reacts with the SPM that increases in liquid temperature. Holes joining the interior and the exterior of the resist are thereby formed in the cured layer in the process of increase of the liquid temperature of the SPM. Therefore, even if the uncured layer of the resist vaporizes, the vaporized components are expelled through the holes in the cured layer and the internal pressure of the resist does not rise easily. Popping of the resist (popping of the cured layer) is thus unlikely to occur in comparison to a case where the SPM of the stripping temperature is supplied to the substrate W from the beginning. The resist can thereby be removed from the substrate W while suppressing or preventing the damaging of the pattern disposed inside the resist.

Also, with the first embodiment, before the SPM is supplied to the substrate W, the substrate W is heated to make the temperature of the substrate W approach the liquid temperature (initial temperature) of the SPM when the supply of the SPM to the substrate W is started. The temperature of the resist can thereby be suppressed or prevented from increasing rapidly due to the start of supplying of the SPM. The internal pressure of the resist can thereby be suppressed or prevented from increasing rapidly at the start of supplying of the SPM even when the initial temperature of the SPM is high. Occurrence of pattern damage due to popping of the resist can thereby be suppressed or prevented.

Also, with the first embodiment, the antistatic liquid, which conducts electricity, is supplied to the substrate W before the SPM is supplied to the substrate W. Therefore, when the substrate W is charged, the charges move from the substrate W to the antistatic liquid and the charges are removed from the substrate W. In particular, the specific resistance of the antistatic liquid is greater than the specific resistance of the SPM and therefore the charges move slowly from the substrate W to the antistatic liquid. Damaging of the device formed on the substrate W due to heat generation or discharge caused by rapid movement of charges can thus be prevented. Degradation of quality of the substrate W can thereby be suppressed or prevented.

Also, with the first embodiment, the hydrogen peroxide solution is supplied to the substrate W after the antistatic liquid has been supplied to the substrate W. The SPM is supplied to the substrate W thereafter. The antistatic liquid remaining on the substrate W is removed from the substrate W by the supply of the hydrogen peroxide solution. The SPM is thus supplied to the substrate W in a state in which the residual amount of the antistatic liquid is decreased. The antistatic liquid and the SPM are generally high in reactivity.

The SPM can thus be suppressed or prevented from increasing in temperature excessively. The uniformity of concentration of the SPM can also be suppressed or prevented from decreasing due to the mixing of the SPM and the antistatic liquid in only a partial region of the substrate W. The degradation of quality of the substrate W can thereby be suppressed or prevented.

Also with the first embodiment, the hydrogen peroxide solution of lower temperature than the initial temperature of the SPM (the liquid temperature of the SPM when the supply of the SPM to the substrate W is started) is supplied to the substrate W after the antistatic liquid has been supplied to the substrate W. The substrate W is heated when the hydrogen peroxide solution is held on the substrate W and the temperature of the substrate W is thereby made to approach the initial temperature of the SPM. The temperature of the resist can thus be suppressed or prevented from increasing rapidly due to the start of supplying of the SPM. The occurrence of pattern damage due to popping of the resist can thereby be suppressed or prevented.

Figure 8:
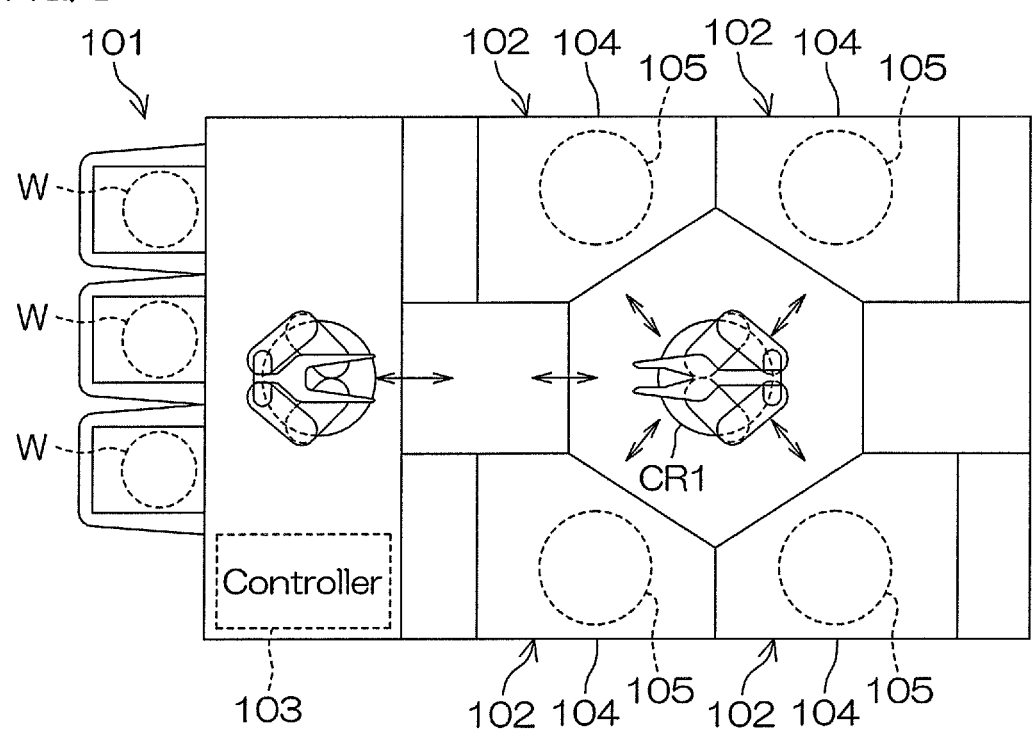
FIG. 8 is a schematic plan view of a substrate processing apparatus according to a second embodiment of the present invention.
Figure 9:
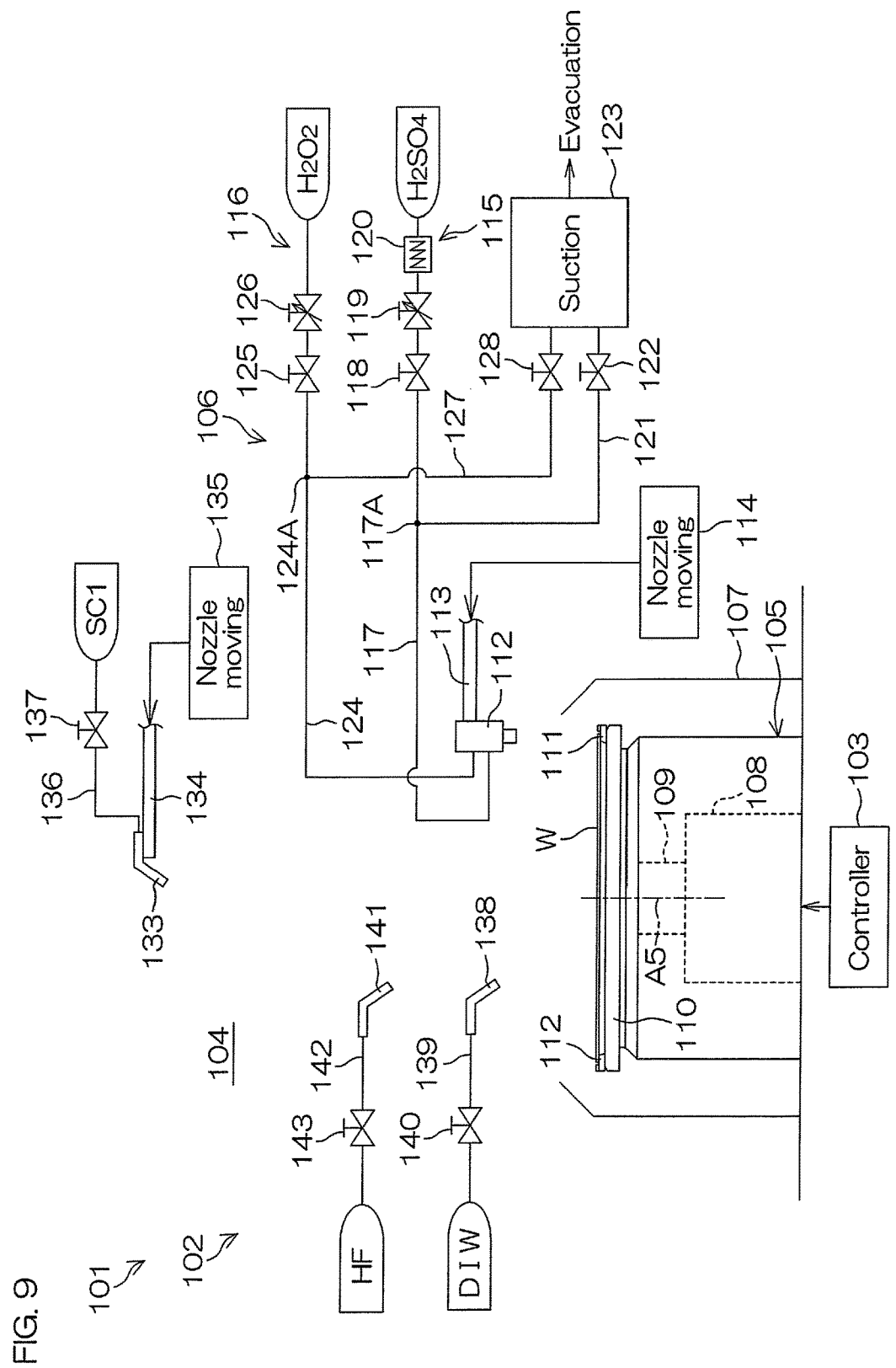
FIG. 9 is a horizontally-viewed schematic view of the interior of a chamber shown in FIG. 8.

FIG. 8 is a schematic plan view of a substrate processing apparatus 101 according to a second embodiment of the present invention. FIG. 9 is a horizontally-viewed schematic view of the interior of a chamber 104 included in the substrate processing apparatus 101.

As shown in FIG. 8, the substrate processing apparatus 101 is a single substrate processing type apparatus that processes a disk-shaped substrate W, such as a semiconductor wafer, etc., one by one. The substrate processing apparatus 101 includes a plurality of processing units 102, each processing the substrate W using processing liquids and processing gases, a substrate transfer robot CR1 performing carrying-in and carrying-out of the substrate W with respect to the chamber 104 of each processing unit 102, and a controller 103 controlling operations of apparatuses and opening and closing of valves provided in the substrate processing apparatus 101.

As shown in FIG. 9, each processing unit 102 is a single substrate processing type unit. Each processing unit 102 includes the box-shaped chamber 104 that has an internal space, a spin chuck 105 holding a single substrate W in a horizontal attitude inside the chamber 104 and rotating the substrate W around a vertical substrate rotation axis A5 passing through the center of the substrate W, an SPM supplying apparatus 106 supplying an SPM (a mixed solution containing $H_2SO_4$ and $H_2O_2$) to the substrate W held by the spin chuck 105, and a cylindrical cup 107 surrounding a periphery of the spin chuck 105 around the rotation axis A5.

As shown in FIG. 9, as the spin chuck 105, for example, that of a clamping type is adopted. Specifically, the spin chuck 105 includes a spin motor 108, a spin shaft 109 made integral to a drive shaft of the spin motor 108, a disk-shaped spin base 110 mounted substantially horizontally on an upper end of the spin shaft 109, and a plurality of clamping members 111 disposed at a plurality of locations at substantially equiangular intervals of a peripheral edge portion of the spin base 110. The plurality of clamping members 111 clamp the substrate W in a substantially horizontal attitude. When the spin motor 108 is driven in this state, the spin base 110 is rotated around the predetermined rotation axis A5 by the driving force and, along with the spin base 110, the substrate W is rotated around the rotation axis A5 while being maintained in the substantially horizontal attitude.

The spin chuck 105 is not restricted to a clamping type and, for example, a vacuum suction type (vacuum chuck) arrangement that vacuum-suctions the rear surface of the substrate W to hold the substrate W in a horizontal attitude and further performs rotation around a vertical rotation axis in this state to rotate the substrate W held by the spin chuck 105 may be adopted instead.

As shown in FIG. 9, the SPM supplying apparatus 106 includes an SPM nozzle (mixed solution nozzle, mixing portion) 112 discharging the SPM toward the upper surface of the substrate W, a fourth nozzle arm 113 having the SPM nozzle 112 mounted on a tip portion, and a fourth nozzle moving apparatus 114 moving the fourth nozzle arm 113 to move the SPM nozzle 112.

The SPM nozzle 112 is, for example, a straight nozzle that discharges the SPM or a hydrogen peroxide solution in a continuous flow state and is mounted on the fourth nozzle arm 113 in a perpendicular attitude of discharging a processing liquid in a direction perpendicular to the upper surface of the substrate W. The fourth nozzle arm 113 extends in a horizontal direction and is disposed so as to be rotatable around a predetermined swinging axis extending in a vertical direction at a periphery of the spin chuck 105. The SPM nozzle 112 may instead be held by the fourth nozzle arm 113 in an inwardly directed attitude of discharging the SPM or the hydrogen peroxide solution in a discharge direction that is inclined with respect to the upper surface of the substrate W so that the SPM or the hydrogen peroxide solution lands at a position further inward (further toward the rotation axis A5) than the discharge port or be held by the fourth nozzle arm 113 in an outwardly directed attitude of discharging the SPM or the hydrogen peroxide solution in a discharge direction that is inclined with respect to the upper surface of the substrate W so that the SPM or the hydrogen peroxide solution lands at a position further outward (further toward the side opposite the rotation axis A5) than the discharge port.

The fourth nozzle moving apparatus 114 rotates the fourth nozzle arm 113 around the predetermined swinging axis (not shown) to move the SPM nozzle 112 horizontally along a locus passing through the upper surface central portion of the substrate W in a plan view. The fourth nozzle moving apparatus 114 makes the SPM nozzle 112 move horizontally between a processing position at which the SPM discharged from the SPM nozzle 112 lands on the upper surface of the substrate W and a retracted position at which the SPM nozzle 112 is retracted to the periphery of the spin chuck 5 in a plan view. Further, the fourth nozzle moving apparatus 114 makes the SPM nozzle 112 move horizontally between a central position at which the SPM or the hydrogen peroxide solution discharged from the SPM nozzle 112 lands at the upper surface central portion of the substrate W and a peripheral edge position at which the SPM or the hydrogen peroxide solution discharged from the SPM nozzle 112 lands at an upper surface peripheral edge portion of the substrate W. The central position and the peripheral edge positions are both processing positions.

The SPM supplying apparatus 106 includes a sulfuric acid supplying unit 115 supplying sulfuric acid to the SPM nozzle 112 and a hydrogen peroxide solution supplying unit 116 supplying the hydrogen peroxide solution to the SPM nozzle 112. The sulfuric acid supplying unit 115 includes a sulfuric acid piping 117 connected to the SPM nozzle 112 and supplied with the sulfuric acid from a sulfuric acid supply source (not shown), a sulfuric acid valve 118 and a sulfuric acid flow control valve 119 interposed in that order from the SPM nozzle 112 side in intermediate portions of the sulfuric acid piping 117, and a heater 120 maintaining the sulfuric acid at a temperature (a fixed temperature in a range of 60 to 90° C., for example, 80° C.) that is higher than the room temperature. Although not illustrated, the sulfuric acid flow control valve 119 includes a valve body having a valve seat provided in the interior, a valve element opening and closing the valve seat, and an actuator that moves the valve element between an open position and a closed position. The same applies to other flow control valves.

The heater 120 that heats the sulfuric acid may be a single pass type heater as shown in FIG. 9 or may be a circulation type heater that heats the sulfuric acid by making the sulfuric acid circulate in the interior of a circulation path that includes the heater.

The hydrogen peroxide solution supplying unit 116 includes a hydrogen peroxide solution piping 124 connected to the SPM nozzle 112 and supplied with hydrogen peroxide from a hydrogen peroxide rinse liquid supply source (not shown) and a hydrogen peroxide solution valve 125 and a hydrogen peroxide solution flow control valve 126 interposed in that order from the SPM nozzle 112 side in intermediate portions of the hydrogen peroxide solution piping 124. The hydrogen peroxide solution of approximately room temperature (approximately 25° C.) that is not temperature-adjusted is supplied to the SPM nozzle 112 via the hydrogen peroxide solution piping 124.

FIG. 10 is an illustrative sectional view of the arrangement of the SPM nozzle 112. The SPM nozzle 112 has, for example, a so-called straight nozzle arrangement. The SPM nozzle 112 includes a casing 151 with a substantially circularly cylindrical shape. The SPM nozzle 112 is mounted on the fourth nozzle arm 113 (see FIG. 9) in a vertical attitude in which a central axis of the casing 151 extends in a vertical direction. The casing 151 includes a first circularly cylindrical portion 157 and a second circularly cylindrical portion 158 that is smaller in diameter than the first circularly cylindrical portion 157 and is coaxial with the first circularly cylindrical portion 157. The second circularly cylindrical portion 158 is smaller in diameter than the first circularly cylindrical portion 157 and therefore a flow path section of the interior of the second circularly cylindrical portion 158 is smaller in area than the flow path section of the first circularly cylindrical portion 157.

A sulfuric acid inlet 152 introducing the sulfuric acid and a hydrogen peroxide solution inlet 153 introducing the hydrogen peroxide solution are formed at lower portions of a side wall of the casing 151. The sulfuric acid inlet 152 is disposed at a position lower than the hydrogen peroxide solution inlet 153. The sulfuric acid piping 117 is connected to the sulfuric acid inlet 152, and the hydrogen peroxide solution piping 124 is connected to the hydrogen peroxide solution inlet 153. A mixing chamber 154 is demarcated and defined by the first circularly cylindrical portion 157 of the casing 151.

When the sulfuric acid valve 118 (see FIG. 9) and the hydrogen peroxide solution valve 125 (see FIG. 9) are opened, the sulfuric acid from the sulfuric acid piping 117 is supplied to the mixing chamber 154 via the sulfuric acid inlet 152 and the hydrogen peroxide solution from the hydrogen peroxide solution piping 124 is supplied to the mixing chamber 154 via the hydrogen peroxide solution inlet 153. The sulfuric acid and the hydrogen peroxide solution that flow into the mixing chamber 154 are mixed (stirred) sufficiently in the interior of the chamber. By the mixing, the sulfuric acid and the hydrogen peroxide solution are mixed uniformly, the mixed solution (SPM) of the sulfuric acid and the hydrogen peroxide solution is formed by the reaction of the sulfuric acid and the hydrogen peroxide solution, and the SPM is heated to a temperature (of no less than 100° C., for example, 160° C.) that is higher than the temperatures of the sulfuric acid and the hydrogen peroxide solution before the mixing. A discharge port 156 arranged to discharge the formed SPM toward an external space 155 is opened in a tip (lower end) of the second circularly cylindrical portion 158 of the casing 151. The high temperature SPM formed in the mixing chamber 154 is discharged from the discharge port 156 via the interior of the second circularly cylindrical portion 158. The SPM contains peroxomonosulfuric acid, which has a high oxidizing power.

As shown in FIG. 9, one end of a sulfuric acid suction piping 121, arranged to suction the sulfuric acid inside the sulfuric acid piping 117, is branchingly connected to a first branch position 117A in the sulfuric acid piping 117 between the SPM nozzle 112 and the sulfuric acid valve 118. A sulfuric acid suction valve 122 is interposed in the sulfuric acid suction piping 121 and the other end of the sulfuric acid suction piping 121 is connected to a suction apparatus 123. With the second embodiment, the suction apparatus 123 is put in a constantly actuated state. When the sulfuric acid suction valve 122 is opened, the interior of the sulfuric acid suction piping 121 is evacuated and the sulfuric acid in the interior of the sulfuric acid suction piping 121 further downstream than the sulfuric acid valve 118 is suctioned via the sulfuric acid suction piping 121 by the suction apparatus 123.

As shown in FIG. 9, one end of a hydrogen peroxide solution suction piping 127, arranged to suction the hydrogen peroxide solution inside the hydrogen peroxide solution piping 124, is branchingly connected to a second branch position 124A in the hydrogen peroxide solution piping 124 between the SPM nozzle 112 and the hydrogen peroxide solution valve 125. A hydrogen peroxide solution suction valve 128 is interposed in the hydrogen peroxide solution suction piping 127 and the other end of the hydrogen peroxide solution suction piping 127 is connected to the suction apparatus 123. When the hydrogen peroxide solution suction valve 128 is opened, the interior of the hydrogen peroxide solution suction piping 127 is evacuated and the hydrogen peroxide solution present in the interior of the hydrogen peroxide solution piping 124 further downstream than the hydrogen peroxide solution valve 125 is suctioned via the hydrogen peroxide solution suction piping 127 by the suction apparatus 123. In the second embodiment, a suction unit according to the claims is arranged by the suction apparatus 123, the hydrogen peroxide solution suction piping 127, and the hydrogen peroxide solution suction valve 128.

Although in FIG. 9, a case where the suction apparatus 123 arranged to suction the hydrogen peroxide solution is used in common as the suction apparatus arranged to suction the sulfuric acid is illustrated as an example, the suction apparatus 123 arranged to suction the sulfuric acid and a suction apparatus arranged to suction the hydrogen peroxide solution may be provided separately instead.

As shown in FIG. 9, the processing unit 102 includes an SC1 nozzle 133 discharging an SC1 (a mixed solution containing $NH_4OH$ and $H_2O_2$) toward the upper surface of the substrate W, a fifth nozzle arm 134 having the SC1 nozzle 133 mounted at a tip portion, and a fifth nozzle moving apparatus 135 moving the fifth nozzle arm 134 to move the SC1 nozzle 133.

As shown in FIG. 9, the processing unit 102 includes an SC1 piping 136 guiding the SC1 to the SC1 nozzle 133 and an SC1 valve 137 opening and closing the interior of the SC1 piping 136. When the SC1 valve 137 is opened, the SC1 from an SC1 chemical solution supply source is supplied from the SC1 piping 136 to the SC1 nozzle 133. The SC1 (liquid) is thereby discharged from the SC1 nozzle 133.

As shown in FIG. 9, the processing unit 102 includes an etching solution nozzle 141 discharging an etching solution toward the upper surface of the substrate W. The etching solution nozzle 141 is, for example, a straight nozzle that discharges liquid in a continuous flow state and is disposed fixedly above the spin chuck 105 with its discharge port directed toward the upper surface central portion of the substrate W. An etching solution piping 142, supplied with the etching solution from an etching solution supply source, is connected to the etching solution nozzle 141. An etching solution valve 143 arranged to switch between supplying and stopping the supply of the etching solution from the etching solution nozzle 141 is interposed in an intermediate portion of the etching solution piping 142. For example, hydrofluoric acid (HF) is adopted as the etching solution.

As shown in FIG. 9, the processing unit 102 includes a rinse liquid nozzle 138 discharging a rinse liquid toward the upper surface of the substrate W. The rinse liquid nozzle 138 is, for example, a straight nozzle that discharges liquid in a continuous flow state and is disposed fixedly above the spin chuck 105 with its discharge port directed toward the upper surface central portion of the substrate W. A rinse liquid piping 139, supplied with the rinse liquid from a rinse liquid supply source, is connected to the rinse liquid nozzle 138. A rinse liquid valve 140 arranged to switch between supplying and stopping the supply of the rinse liquid from the rinse liquid nozzle 138 is interposed in an intermediate portion of the rinse liquid piping 139. Although for example, DIW (deionized water) is adopted as the rinse liquid supplied to the rinse liquid nozzle 138, carbonated water, electrolyzed ion water, ozone water, aqueous hydrochloric acid solution of dilute concentration (for example, approximately 10 to 100 ppm), or reduced water (hydrogen water), etc., may also be adopted as the rinse liquid.

Each of the etching solution nozzle 141 and the rinse liquid nozzle 138 is not required to be fixedly disposed with respect to the spin chuck 5 and, for example, a so-called scan nozzle form, with which the nozzles are mounted on an arm that is swingable within a horizontal plane above the spin chuck 105 and the liquid landing positions of the etching solution and the rinse liquid on the upper surface of the substrate W are scanned, may be adopted instead.

As shown in FIG. 9, the cup 107 is disposed further outward than the substrate W held by the spin chuck 105. The cup 107 surrounds the spin base 110. When a processing liquid (the etching solution, SPM, SC1, or rinse liquid, etc.) is supplied to the substrate W in a state where the spin chuck 105 is rotating the substrate W, the processing liquid splashes from the peripheral edge portion of the substrate W to the periphery of substrate W. When the processing liquid is supplied to the substrate W, an upper end portion of the upwardly open cup 107 is disposed higher than the spin base 110. The processing liquid that is expelled to the periphery of the substrate W is thus received by the cup 107. The processing liquid received by the cup 107 is fed to a recovery apparatus (not shown) or a drain apparatus (not shown).

As shown in FIG. 8 and FIG. 9, the controller 103 has an arrangement that includes, for example, a microcomputer. The controller 103 controls the operations of the spin motor 108, the nozzle moving apparatuses 114 and 135, the heater 120, the suction apparatus 123, etc., in accordance with a predetermined program. Further, the controller 103 controls the opening/closing of the sulfuric acid valve 118, the hydrogen peroxide solution valve 125, the suction valves 122 and 128, the SC1 valve 137, the rinse liquid valve 140, the etching solution valve 143, etc., and controls the opening degrees of the flow control valves 119 and 126.

FIG. 11A and FIG. 11B are sectional views for describing examples of surface states of the substrate W processed by the substrate processing apparatus 101.

As shown in FIG. 11A, the substrate W is, for example, a semiconductor wafer with a resist 302 disposed on the front surface. In a photolithography process, the resist 302 is disposed on the front surface of the substrate W and light irradiation (UV irradiation) is performed on the resist (photolithography) to perform pattern transfer onto the resist 302. As shown in FIG. 11A, for example, a silicon oxide film 301 is formed on the front surface of the substrate W and the resist 302 is disposed on the silicon oxide film 301. After the pattern transfer, the resist 302 has a pattern groove 303 formed by the photolithography process. In the following, a process example of a resist removing process of removing the resist 302, which has become unnecessary, from the front surface of such a substrate W shall be described. In the following process example, the silicon oxide film 301 is etched to a predetermined pattern prior to the resist removing process.

Figure 12:
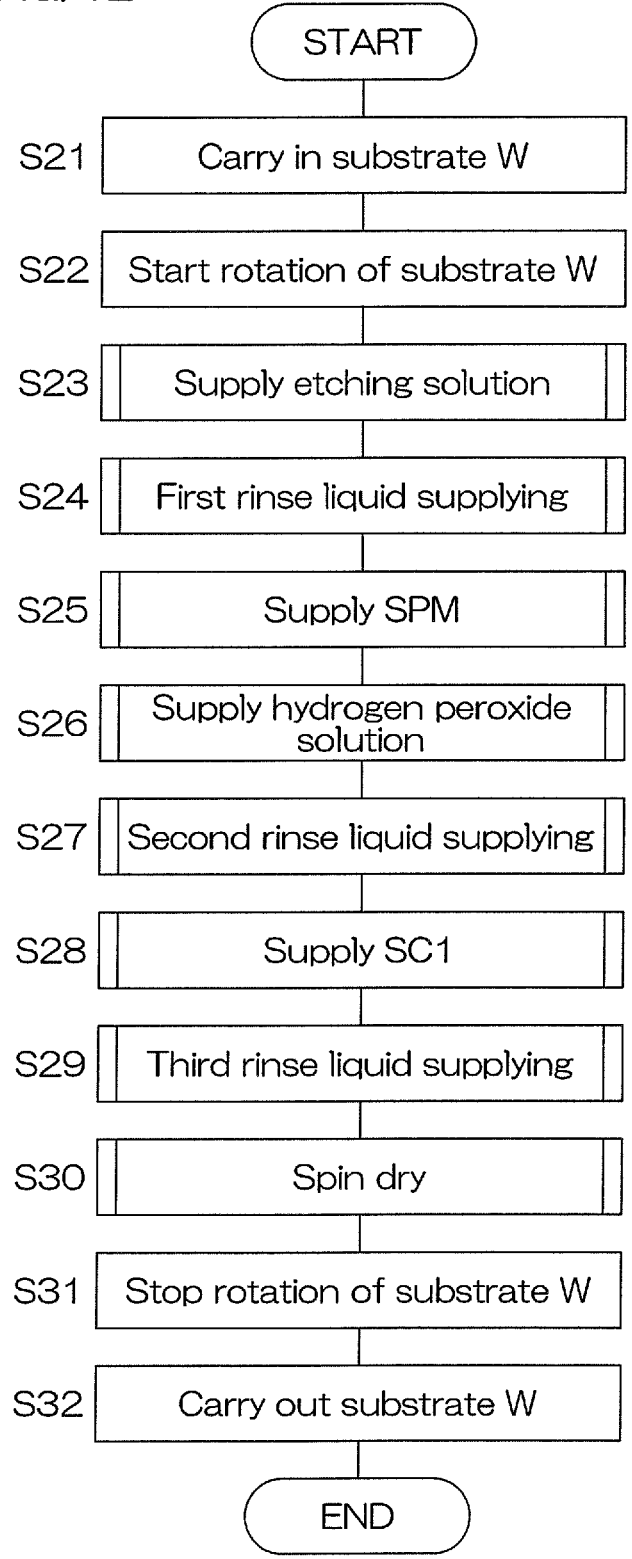
FIG. 12 is an outline flowchart of a process example of a resist removing process performed by a processing unit shown in FIG. 9.

FIG. 12 is an outline flowchart of the process example of the resist removing process performed by the processing unit 102. FIG. 13A to FIG. 13E are diagrams for describing states inside the sulfuric acid piping 117 and the hydrogen peroxide solution piping 124. The resist removing process shall be described with reference to FIG. 9 and FIG. 12. FIG. 13A to FIG. 13E shall also be referenced where suitable.

When the resist removing process is to be performed on the substrate W by the processing unit 102, the ion implantation processed substrate W (see FIG. 11A) is carried into the chamber 104 (step S21 of FIG. 12). Specifically, in a state where all of the nozzles, etc., are retracted from above the spin chuck 105, the controller 103 makes the hand of the transfer robot CR1 that holds the substrate W enter inside the chamber 104 to transfer the substrate W, with its front surface facing upward, onto the spin chuck 105. Thereafter, the controller 103 starts the rotation of the substrate W by the spin motor 108 (step S22 of FIG. 12). The rotation of the substrate W is increased to a predetermined liquid processing speed (within a range of 300 to 1000 rpm, for example, 500 rpm) and is maintained at the liquid processing speed.

When the rotation speed of the substrate W reaches the liquid processing speed, an etching solution supplying step (step S23 of FIG. 12) is performed next. Specifically, the controller 103 opens the etching solution valve 143 to make the etching solution (hydrofluoric acid (HF)) be discharged from the etching solution nozzle 141 toward the upper surface central portion of the substrate W in the rotating state. The etching solution discharged from the etching solution nozzle 141 is supplied to the upper surface central portion of the substrate W and flows along the upper surface of the substrate W toward the peripheral edge of the substrate W upon receiving the centrifugal force due to the rotation of the substrate W. The entire upper surface of the substrate W is thereby covered with a liquid film of the etching solution. By this etching, a portion corresponding to the pattern groove 303 of the silicon oxide film 301 is removed from above the upper surface (front surface) of the substrate W as shown in FIG. 11B and the predetermined pattern is formed in the silicon oxide film 301. After the etching process, the front surface of the substrate W exhibits hydrophobicity.

When a predetermined time elapses from the start of discharge of the etching solution, the etching solution valve 143 is closed to stop the discharge of the etching solution, and then a first rinse liquid supplying step (step S24 of FIG. 12) of supplying DIW or other rinse liquid to the substrate W is performed. Specifically, the controller 103 opens the rinse liquid valve 140 to make the rinse liquid be discharged from the rinse liquid nozzle 138 toward the upper surface central portion of the substrate W in the rotating state. The etching solution on the substrate W is thus forced to flow outward by the rinse liquid and is expelled to the periphery of the substrate W. The liquid film of the etching solution on the substrate W is thus replaced by a liquid film of the rinse liquid that covers the entire upper surface of the substrate W.

When a predetermined time elapses from the start of discharge of the rinse liquid, the rinse liquid valve 140 is closed to stop the discharge of the rinse liquid, and then an SPM supplying step (step S25 of FIG. 12) of supplying the SPM to the substrate W is performed. Specifically, the controller 103 controls the fourth nozzle moving apparatus 114 to move the SPM nozzle 112 from the retracted position to the processing position. The SPM nozzle 112 is thereby positioned above the substrate W.

Figure 13A:
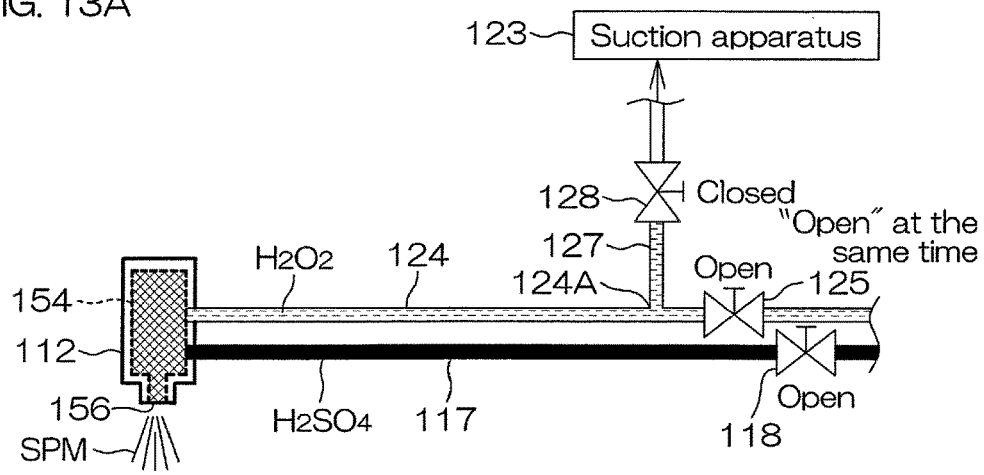
FIG. 13A is a diagram for describing states inside a sulfuric acid piping and a hydrogen peroxide solution piping in an SPM supplying step.

After the SPM nozzle 112 has been positioned above the substrate W, the controller 103 opens the sulfuric acid valve 118 and the hydrogen peroxide solution valve 125 at the same time as shown in FIG. 13A.

The sulfuric acid flowing through the interior of the sulfuric acid piping 117 is thereby supplied to the SPM nozzle 112 and the hydrogen peroxide solution flowing through the hydrogen peroxide solution piping 124 is supplied to the SPM nozzle 112. The sulfuric acid and the hydrogen peroxide solution are mixed in the mixing chamber 154 of the SPM nozzle 112 to form the SPM of a high temperature (for example, 160° C.). The SPM is discharged from the discharge port 156 of the SPM nozzle 112 toward the upper surface of the substrate W that is rotating at the liquid processing speed as shown in FIG. 13A. In this state, the controller 103 controls the fourth nozzle moving apparatus 114 to make the liquid landing position of the SPM with respect to the upper surface of the substrate W move between the central portion and the peripheral edge portion.

The SPM discharged from the SPM nozzle 112 lands on the upper surface of the substrate W and thereafter flows outward along the upper surface of the substrate W due to the centrifugal force. The SPM is thus supplied to the entire upper surface of the substrate W and an SPM liquid film covering the entire upper surface of the substrate W is formed on the substrate W. The resist film and the SPM thus undergo a chemical reaction and the resist film on the substrate W is removed from the substrate W by the SPM. Further, in the state where the substrate W is rotating, the controller 103 moves the liquid landing position of the SPM with respect to the substrate W between the central portion and the peripheral edge portion so that the liquid landing position of the SPM passes through the entire upper surface of the substrate W and the entire upper surface of the substrate W is scanned. The SPM discharged from the SPM nozzle 112 is thus supplied to the entire upper surface of the substrate W and the entire upper surface of the substrate W is processed uniformly.

When a predetermined SPM processing time elapses from the start of discharge of the SPM, the controller 103 closes the sulfuric acid valve 118 and the hydrogen peroxide solution valve 125. The discharge of the SPM is thereby stopped.

Figure 13B:
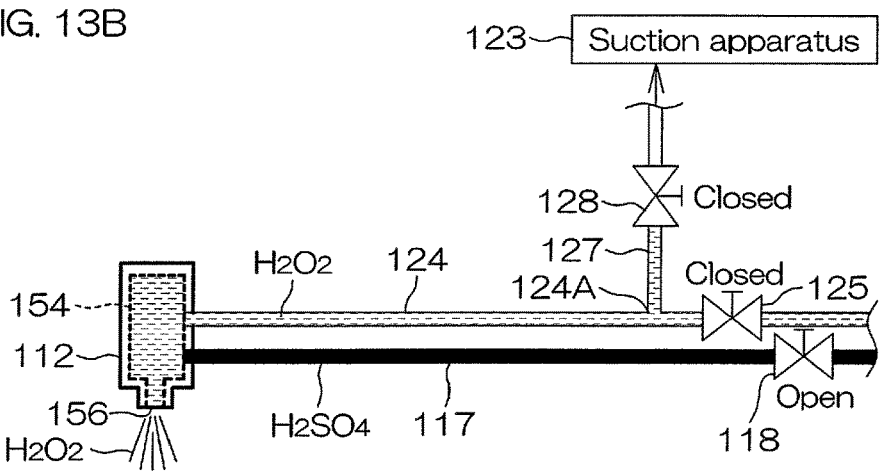
FIGS. 13B to 13E are diagrams for describing states inside the sulfuric acid piping and the hydrogen peroxide solution piping in a hydrogen peroxide solution supplying step.

Thereafter, a hydrogen peroxide solution supplying step (step S26 of FIG. 12) of supplying the hydrogen peroxide solution to the substrate W is performed. Specifically, the controller 103 controls the fourth nozzle moving apparatus 114 to position the SPM nozzle 112 above the upper surface central portion of the substrate W and thereafter opens the hydrogen peroxide solution valve 125 while maintaining the sulfuric acid valve 118 in the closed state as shown in FIG. 13B. Only the hydrogen peroxide solution is thereby supplied to the SPM nozzle 112 upon flowing through the interior of the hydrogen peroxide solution piping 124 without the sulfuric acid flowing through the interior of the sulfuric acid piping 117. The hydrogen peroxide solution supplied to the SPM nozzle 112 flows through the interior of the SPM nozzle 112 and is discharged from the discharge port 156 of the SPM nozzle 112. The hydrogen peroxide solution is discharged from the discharge port 156 of the SPM nozzle 112 toward the upper surface central portion of the substrate W that is rotating at the liquid processing speed as shown in FIG. 13B.

The hydrogen peroxide solution that has landed on the upper surface central portion of the substrate W flows outward along the substrate W toward the peripheral edge of the substrate W. The SPM on the substrate W is replaced by the hydrogen peroxide solution and eventually, the entire upper surface of the substrate W is covered by a liquid film of the hydrogen peroxide solution.

Although it was described that the hydrogen peroxide solution valve 125 is closed once in the transition from the SPM supplying step (step S25 of FIG. 25) to the hydrogen peroxide solution supplying step (step S26 of FIG. 12), after the end of the SPM supplying step (step S25 of FIG. 12), the transition to the hydrogen peroxide solution supplying step (step S26 of FIG. 12) may be performed by closing only the sulfuric acid valve 118 while maintaining the hydrogen peroxide solution valve 125 in the open state.

When a predetermined hydrogen peroxide solution supplying time elapses from the start of discharge of the hydrogen peroxide solution, the controller 103 closes the hydrogen peroxide solution valve 125 to stop the discharge of the hydrogen peroxide solution from the SPM nozzle 112.

Figure 13C:
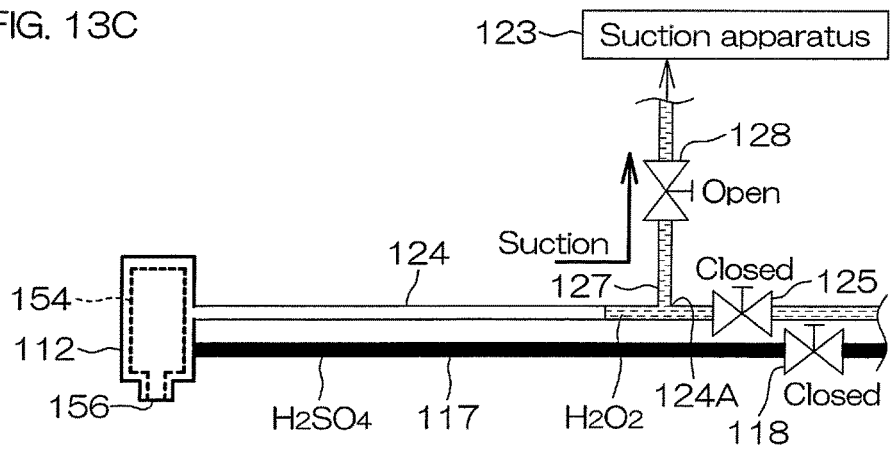

After the discharge of the hydrogen peroxide solution from the SPM nozzle 112 is stopped, the hydrogen peroxide solution present in the interior of the hydrogen peroxide solution piping 124 is suctioned. Specifically, the controller 103 opens the hydrogen peroxide solution suction valve 128 while maintaining the hydrogen peroxide solution valve 125 in the closed state as shown in FIG. 13C. The action of the suction apparatus 123 that is put in the constantly actuated state is thereby made effective and the hydrogen peroxide solution present in the interior of the hydrogen peroxide solution piping 124 further downstream than the hydrogen peroxide solution valve 125 is suctioned by the suction apparatus 123 via the hydrogen peroxide solution suction piping 127. By the suctioning of the interior of the hydrogen peroxide solution piping 124 by the suction apparatus 123, a portion of the hydrogen peroxide solution is eliminated from inside the hydrogen peroxide solution piping 124 and, as shown in FIG. 13C, a tip surface of the hydrogen peroxide solution is retracted significantly from the tip of the hydrogen peroxide solution piping 124. After elapse of a predetermined time, the controller 103 closes the hydrogen peroxide solution suction valve 128 and the suctioning of the interior of the hydrogen peroxide solution piping 124 is thereby ended.

After the suctioning, the controller 103 controls the forth nozzle moving apparatus 114 to make the SPM nozzle 112 retract from above the substrate W to the retracted position.

After the closing of the sulfuric acid valve 118, a small amount of the sulfuric acid may enter from the sulfuric acid piping 117 into the SPM nozzle 112 (trickling-in of the sulfuric acid). The sulfuric acid is higher in specific gravity than the hydrogen peroxide solution and therefore the sulfuric acid that trickles in moves downward inside the SPM nozzle 112.

In this case, if the sulfuric acid inlet 152 (see FIG. 10) is disposed higher than the hydrogen peroxide solution inlet 153 (see FIG. 10), the downwardly moving sulfuric acid may be suctioned into the hydrogen peroxide solution piping 124 in accompaniment with the suctioning of the hydrogen peroxide solution inside the hydrogen peroxide solution piping 124. Consequently, the sulfuric acid and the hydrogen peroxide solution may become mixed accidentally inside the hydrogen peroxide solution piping 124.

In contrast, with the second embodiment, the sulfuric acid inlet 152 is disposed lower than the hydrogen peroxide solution inlet 153 in the SPM nozzle 112. Although the sulfuric acid that trickles in moves downward from the sulfuric acid inlet 152 at the lower side, the sulfuric acid moving inside the SPM nozzle 112 will not be suctioned into the hydrogen peroxide solution piping 124 by the suctioning of the hydrogen peroxide solution in the hydrogen peroxide solution piping 124. Accidental mixing of the sulfuric acid and the hydrogen peroxide solution inside the hydrogen peroxide solution piping 124 is thus unlikely to occur. Accidental mixing of the sulfuric acid and the hydrogen peroxide solution inside the hydrogen peroxide solution piping 124 can thereby be prevented.

On the other hand, after the discharge of the hydrogen peroxide solution from the SPM nozzle 112 is stopped, the sulfuric acid present in the interior of the sulfuric acid piping 117 is not suctioned. A tip surface of the sulfuric acid is thus positioned at the tip of the sulfuric acid piping 117 (at the position of connection with the SPM nozzle 112).

When the predetermined hydrogen peroxide solution supplying time elapses from the start of discharge of the hydrogen peroxide solution, a second rinse liquid supplying step (step S27 of FIG. 12) of supplying the DIW or other rinse liquid to the substrate W is then performed. Specifically, the controller 103 opens the rinse liquid valve 140 to make the rinse liquid be discharged from the rinse liquid nozzle 138 toward the upper surface central portion of the substrate W. The rinse liquid discharged from the rinse liquid nozzle 138 lands on the upper surface central portion of the substrate W that is covered by the hydrogen peroxide solution. The rinse liquid that has landed on the upper surface central portion of the substrate W flows along the upper surface of the substrate W toward the peripheral edge of the substrate W upon receiving the centrifugal force due to the rotation of the substrate W. The hydrogen peroxide solution on the substrate W is thus forced to flow outward by the rinse liquid and is expelled to the periphery of the substrate W. The liquid film of the hydrogen peroxide solution on the substrate W is thus replaced by a liquid film of the rinse liquid that covers the entire upper surface of the substrate W. The hydrogen peroxide solution is thereby rinsed off from the entire upper surface of the substrate W. When a predetermined time elapses from the opening of the rinse liquid valve 140, the controller 103 closes the rinse liquid valve 140 to stop the discharge of the rinse liquid from the rinse liquid nozzle 138.

When the predetermined time elapses from the start of discharge of the rinse liquid, an SC1 supplying step (step S28 of FIG. 12) of supplying the SC1 to the substrate W is then performed. Specifically, the controller 103 controls the fifth nozzle moving apparatus 135 to move the SC1 nozzle 133 from the retracted position to the processing position. After the SC1 nozzle 133 has been positioned above the substrate W, the controller 103 opens the SC1 valve 137 to make the SC1 nozzle 133 discharge the SC1 toward the upper surface of the substrate W in the rotating state. In this state, the controller 103 controls the fifth nozzle moving apparatus 135 to make the liquid landing position of the SC1 with respect to the upper surface of the substrate W move between the central portion and the peripheral edge portion. When a predetermined time elapses from the opening of the SC1 valve 137, the controller 103 closes the SC1 valve 137 to stop the discharge of the SC1. Thereafter, the controller 103 controls the fifth nozzle moving apparatus 135 to make the SC1 nozzle 133 retract from above the substrate W.

The SC1 discharged from the SC1 nozzle 133 lands on the upper surface of the substrate W and thereafter flows outward along the upper surface of the substrate W due to the centrifugal force. The rinse liquid on the substrate W is thus forced to flow outward by the SC1 and is expelled to the periphery of the substrate W. The liquid film of rinse liquid on the substrate W is thereby replaced by a liquid film of SC1 that covers the entire upper surface of the substrate W. Further, the controller 103 makes the liquid landing position of the SC1 with respect to the upper surface of the substrate W move between the central portion and the peripheral edge portion in the state where the substrate W is rotating so that the liquid landing position of the SC1 passes through the entire upper surface of the substrate W and the entire upper surface of the substrate W is scanned. The SC1 discharged from the SC1 nozzle 133 is thus supplied to the entire upper surface of the substrate W and the entire upper surface of the substrate W is processed uniformly.

Thereafter, a third rinse liquid supplying step (step S29 of FIG. 12) of supplying the DIW or other rinse liquid to the substrate W is performed. Specifically, the controller 103 opens the rinse liquid valve 140 to make the rinse liquid be discharged from the rinse liquid nozzle 138 toward the upper surface central portion of the substrate W in the rotating state. The SC1 on the substrate W is thereby forced to flow outward by the rinse liquid and is expelled to the periphery of the substrate W. The liquid film of SC1 on the substrate W is thus replaced by a liquid film of the rinse liquid that covers the entire upper surface of the substrate W. When a predetermined time elapses from the opening of the rinse liquid valve 140, the controller 103 closes the rinse liquid valve 140 to stop the discharge of the rinse liquid.

Thereafter a spin drying step (step S30 of FIG. 12) of drying the substrate W is performed. Specifically, the controller 103 controls the spin motor 108 to accelerate the substrate W to a drying rotation speed (for example of several thousand rpm) that is greater than the rotation speed in the SPM supplying step (step S25 of FIG. 12) to the third rinse liquid supplying step (step S29 of FIG. 12) and makes the substrate W rotate at the drying rotation speed. A large centrifugal force is thereby applied to the liquid on the substrate W and the liquid attached to the substrate W is spun off to the periphery of the substrate W. The substrate W is thereby removed of liquid and the substrate W dries. After a predetermined time elapses from the start of high-speed rotation of the substrate W, the controller 103 controls the spin motor 108 to stop the rotation of the substrate W by the spin chuck 105 (step S31 of FIG. 12).

Thereafter, the substrate W is carried out from inside the chamber 104 (step S32 of FIG. 12). Specifically, in the state where all nozzles, etc., are retracted from above the spin chuck 105, the controller 103 makes the hand of the substrate transfer robot CR1 enter into the interior of the chamber 104. The controller 103 then makes the hand of the transfer robot CR1 hold the substrate W on the spin chuck 105. Thereafter, the controller 103 makes the hand of the substrate transfer robot CR1 retract from inside the chamber 104. The processed substrate W is thereby carried out of the chamber 104.

If the next substrate W is to be processed in succession, the next unprocessed substrate W is carried into the interior of the chamber 104. The same process as the process example shown in FIG. 12 is then executed.

Figure 13D:
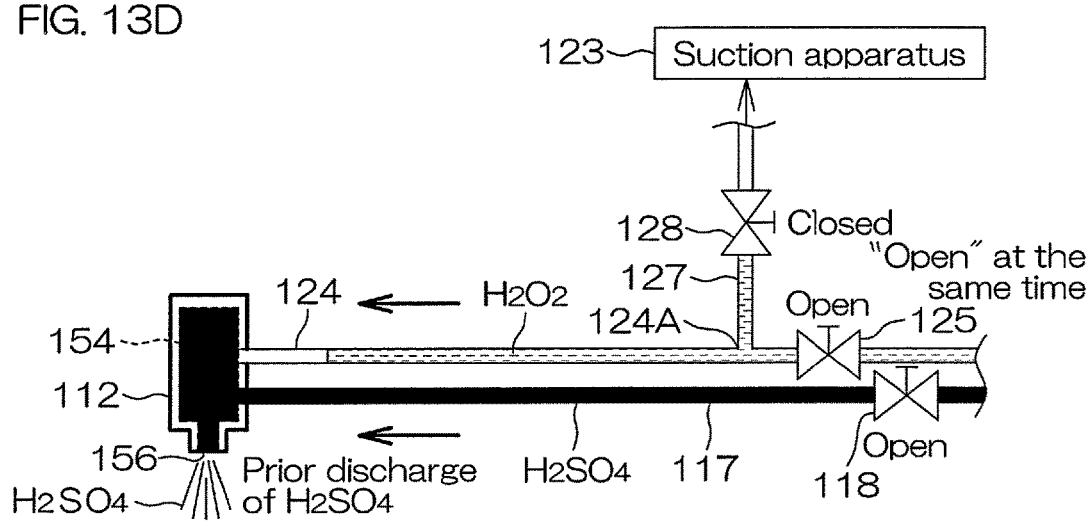

At the start of the SPM supplying step (step S25 of FIG. 12) in the resist removing process performed on the next substrate W, the tip surface of the hydrogen peroxide solution is significantly retracted from the tip of the hydrogen peroxide solution piping 124 as shown in FIG. 13C. On the other hand, the tip surface of the sulfuric acid is positioned at the tip of the sulfuric acid piping 117 (at the position of connection with the SPM nozzle 112). Therefore, when in the SPM supplying step (step S25 of FIG. 12), the controller 103 opens the sulfuric acid valve 118 and the hydrogen peroxide solution valve 125 at the same time as shown in FIG. 13D, the sulfuric acid from the sulfuric acid piping 117 is supplied to the SPM nozzle 112 before the hydrogen peroxide solution from the hydrogen peroxide solution piping 124 and consequently, the sulfuric acid is discharged in advance from the discharge port 156 of the SPM nozzle 112 onto the substrate W with the front surface being a hydrophobic surface.

Figure 13E:
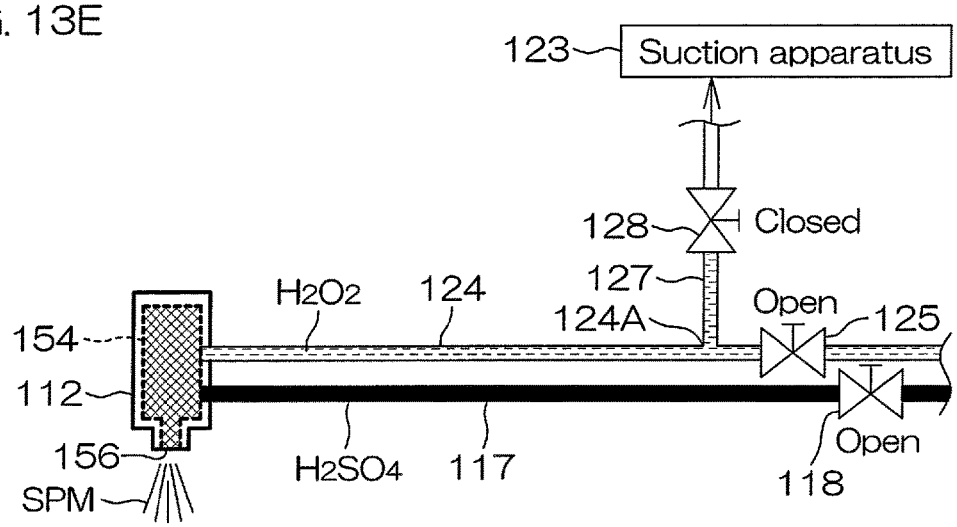

Eventually, as shown in FIG. 13E, the hydrogen peroxide solution from the hydrogen peroxide solution piping 124 is supplied to the SPM nozzle 112 so that the sulfuric acid and the hydrogen peroxide solution are mixed in the interior of the SPM nozzle 112 and the SPM is discharged from the discharge port 156 of the SPM nozzle 112.

As described above, with the second embodiment, when the SPM is to be supplied to the substrate W, the sulfuric acid flows through the interior of the sulfuric acid piping 117 to be supplied to the SPM nozzle 112 and the hydrogen peroxide solution flows through the interior of the hydrogen peroxide solution piping 124 to be supplied to the SPM nozzle 112. The SPM formed at the SPM nozzle 112 is then supplied to the substrate W.

Also, when the hydrogen peroxide solution is to be supplied to the substrate W, only the hydrogen peroxide solution is made to flow through the interior of the hydrogen peroxide solution piping 124 to be supplied to the SPM nozzle 112 without the sulfuric acid being supplied to the SPM nozzle 112. The hydrogen peroxide solution is then supplied to the substrate W.

After the end of the supply of the hydrogen peroxide solution, the hydrogen peroxide solution present in the interior of the hydrogen peroxide solution piping 124 is suctioned. All or a portion of the hydrogen peroxide solution is thereby eliminated from within the hydrogen peroxide solution piping 124 and consequently, a tip surface of the hydrogen peroxide solution in the hydrogen peroxide solution piping 124 is retracted.

The tip surface of the hydrogen peroxide solution in the hydrogen peroxide solution piping 124 is retracted and therefore at the start of the subsequent supplying of the SPM, the sulfuric acid is supplied to the substrate W prior to the SPM. Prior supplying of the hydrogen peroxide solution can thus be prevented reliably at the start of the subsequent supplying of the SPM. Prior supplying of the hydrogen peroxide solution to the substrate W can thus be prevented reliably without causing increase of the SPM consumption amount or decrease of throughput, and therefore the formation of particles on the substrate W front surface can be suppressed or prevented even when the front surface of the substrate W exhibits hydrophobicity as a result of the etching process.

Figure 14:
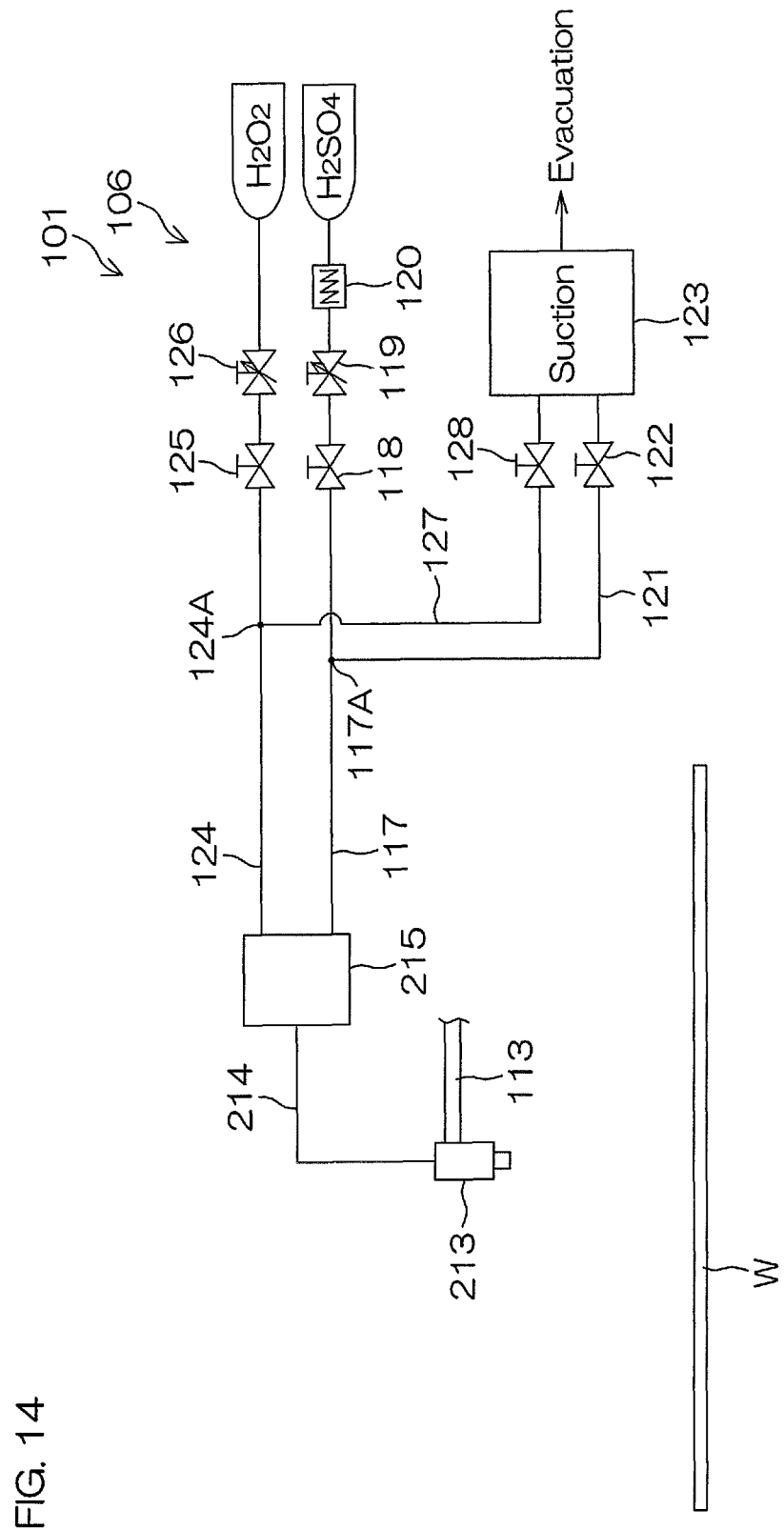
FIG. 14 is a diagram for describing states inside the sulfuric acid piping and the hydrogen peroxide solution piping of an SPM supplying apparatus according to a third embodiment of the present invention.

FIG. 14 is a diagram for describing states inside the sulfuric acid piping 117 and the hydrogen peroxide solution piping 124 of an SPM supplying apparatus 206 according to a third embodiment of the present invention.

In the third embodiment, arrangements equivalent to those of the second embodiment are provided with the same reference symbols as in FIGS. 8 to 13E and description thereof shall be omitted.

The SPM supplying apparatus 206 includes an SPM nozzle (mixed solution nozzle) 213 arranged to discharge the SPM, a mixing portion 215 arranged to mix the sulfuric acid and the hydrogen peroxide solution, and an SPM supplying piping (mixed solution supplying piping) 214 connected between the mixing portion 215 and the SPM nozzle 213.

The sulfuric acid supplying unit 115 and the hydrogen peroxide solution supplying unit 116 are respectively connected to the mixing portion 215. Specifically, the tip of the sulfuric acid piping 117 and the tip of the hydrogen peroxide solution piping 124 are respectively connected to the mixing portion 215. Although the illustration of the heater 120 (see FIG. 9) is omitted in FIG. 14, the sulfuric acid supplying unit 115 has the arrangement that includes the heater 120.

A resist removing process equivalent to the process example of FIG. 12 is performed with the substrate processing apparatus 201 that includes such an SPM supplying apparatus 206. Only the characteristic portions of the substrate processing apparatus 201 in the resist removing process shall now be described.

In the SPM supplying step (step S25 of FIG. 12), the controller 103 opens the sulfuric acid valve 118 and the hydrogen peroxide solution valve 125. The sulfuric acid flowing through the interior of the sulfuric acid piping 117 is thereby supplied to the mixing portion 215 and the hydrogen peroxide solution flowing through the hydrogen peroxide solution piping 124 is supplied to the mixing portion 215. The sulfuric acid and the hydrogen peroxide solution are mixed in the mixing portion 215 to form the SPM of a high temperature (for example, 160° C.), and the SPM is provided to the SPM nozzle 213 via the interior of the SPM supplying piping 214 and discharged from the SPM nozzle 213. The SPM from the SPM nozzle 213 is supplied to the upper surface of the substrate W.

In the hydrogen peroxide solution supplying step (step S26 of FIG. 12), the controller 103 opens the hydrogen peroxide solution valve 125 while maintaining the sulfuric acid valve 118 in the closed state. Only the hydrogen peroxide solution is thereby supplied to the mixing portion 215 upon flowing through the interior of the hydrogen peroxide solution piping 124 without the sulfuric acid flowing through the interior of the sulfuric acid piping 117. The hydrogen peroxide solution supplied to the mixing portion 215 is provided to the SPM nozzle 213 via the interior of the SPM supplying piping 214 and discharged from the SPM nozzle 213. The hydrogen peroxide solution from the SPM nozzle 213 is supplied to the upper surface of the substrate W.

After the end of the hydrogen peroxide solution supplying step (step S26 of FIG. 12) (after the discharge of the hydrogen peroxide solution from the SPM nozzle 213 is stopped), the hydrogen peroxide solution present in the interior of the SPM supplying piping 214 and the interior of the hydrogen peroxide solution piping 124 is suctioned. Specifically, the controller 103 opens the hydrogen peroxide solution suction valve 128 while maintaining the hydrogen peroxide solution valve 125 in the closed state. The action of the suction apparatus 123 that is put in the constantly actuated state is thereby made effective and the hydrogen peroxide solution present in the interior of the SPM supplying piping 214 and the hydrogen peroxide solution present in the interior of the hydrogen peroxide solution piping 124 further downstream than the hydrogen peroxide solution valve 125 are suctioned by the suction apparatus 123 via the hydrogen peroxide solution suction piping 127. By the suctioning of the interior of the hydrogen peroxide solution piping 124 by the suction apparatus 123, all of the hydrogen peroxide solution present in the interior of the SPM supplying piping 214 and a portion of the hydrogen peroxide solution present in the interior of the hydrogen peroxide solution piping 124 are eliminated and the tip surface of the hydrogen peroxide solution is retracted significantly to an intermediate portion of the hydrogen peroxide solution piping 124. After elapse of a predetermined time, the controller 103 closes the hydrogen peroxide solution suction valve 128 and the suctioning of the interior of the hydrogen peroxide solution piping 124 and the interior of the SPM supplying piping 214 is thereby ended.

At the start of the SPM supplying step (step S25 of FIG. 12) in the resist removing process performed on the next substrate W, although the tip surface of the hydrogen peroxide solution is significantly retracted to the intermediate portion of the hydrogen peroxide solution piping 124, the tip surface of the sulfuric acid is positioned at the tip of the sulfuric acid piping 117. Therefore, when in the SPM supplying step (step S25 of FIG. 12), the controller 103 opens the sulfuric acid valve 118 and the hydrogen peroxide solution valve 125 at the same time, the sulfuric acid from the sulfuric acid piping 117 is supplied to the mixing portion 215 before the hydrogen peroxide solution from the hydrogen peroxide solution piping 124 and consequently, the sulfuric acid is discharged in advance from the SPM nozzle 213.

By the above, actions and effects equivalent to those of the second embodiment are exhibited.

An SPM supplying method of a substrate processing apparatus 401 of another mode shall now be described using FIGS. 15A to 15D to further clarify the effects of the invention related to the second and third embodiments.

FIGS. 15A to 15D are illustrative diagrams of an example of an arrangement that supplies an SPM to a substrate in the substrate processing apparatus 401 of another mode. The substrate processing apparatus 401 arranged to perform a resist removing process includes an SPM nozzle 403 arranged to discharge the SPM, a mixing portion 405 arranged to mix sulfuric acid ($H_2SO_4$) and a hydrogen peroxide solution ($H_2O_2$), and an SPM supplying piping 404 connected between the mixing portion 405 and the SPM nozzle 403. A sulfuric acid piping 406, supplied with the sulfuric acid from a sulfuric acid supply source (not shown), and a hydrogen peroxide solution piping 408, supplied with the hydrogen peroxide solution from a hydrogen peroxide solution supply source, are respectively connected to the mixing portion 405. A sulfuric acid valve 407 and a hydrogen peroxide solution valve 409 are interposed respectively in intermediate portions of the sulfuric acid piping 406 and the hydrogen peroxide solution piping 408.

In the resist removing process performed by such a substrate processing apparatus, an SPM supplying step of supplying the SPM to a front surface of the substrate is executed and in continuation to the SPM supplying step, a hydrogen peroxide solution supplying step of supplying the hydrogen peroxide solution to the front surface of the substrate is executed.

Figure 15A:
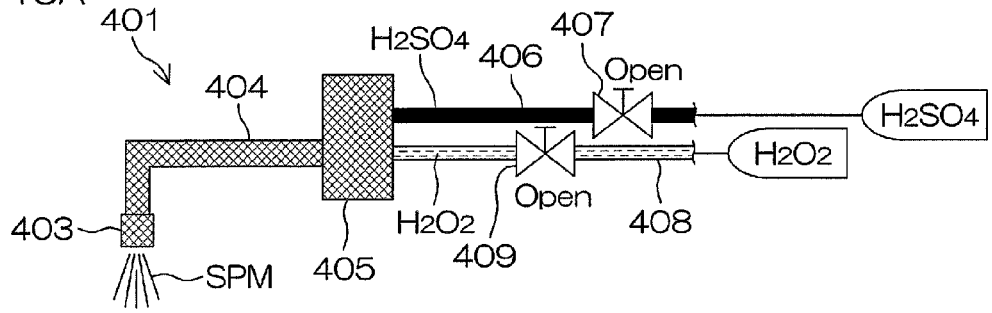
FIGS. 15A-15D are illustrative diagrams showing an example of an arrangement that supplies the SPM to a substrate in a substrate processing apparatus of another mode.

In the SPM supplying step, the sulfuric acid valve 407 and the hydrogen peroxide solution valve 409 are opened at the same time as shown in FIG. 15A. The sulfuric acid flowing through the interior of the sulfuric acid piping 406 is thereby supplied to the mixing portion 405 and the hydrogen peroxide solution flowing through the hydrogen peroxide solution piping 408 is supplied to the mixing portion 405. In the mixing portion 405, the sulfuric acid and the hydrogen peroxide solution are mixed to form the SPM, and the SPM is provided to the SPM nozzle 403 via the interior of the SPM supplying piping 404 and discharged from the SPM nozzle 403. The SPM from the SPM nozzle 403 is supplied to the upper surface of the substrate.

Figure 15B:
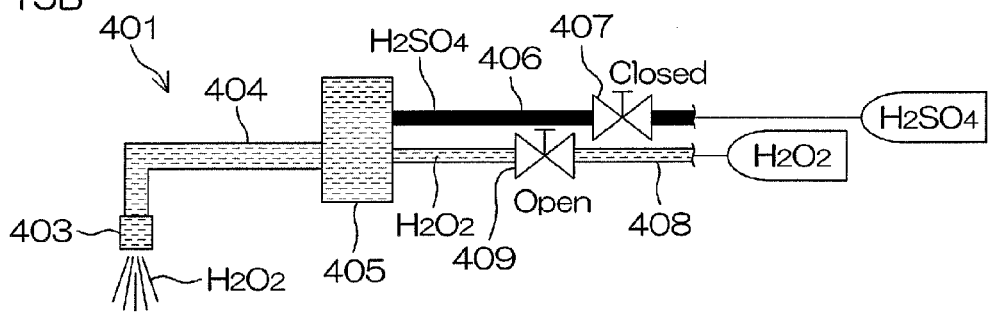
Figure 15C:
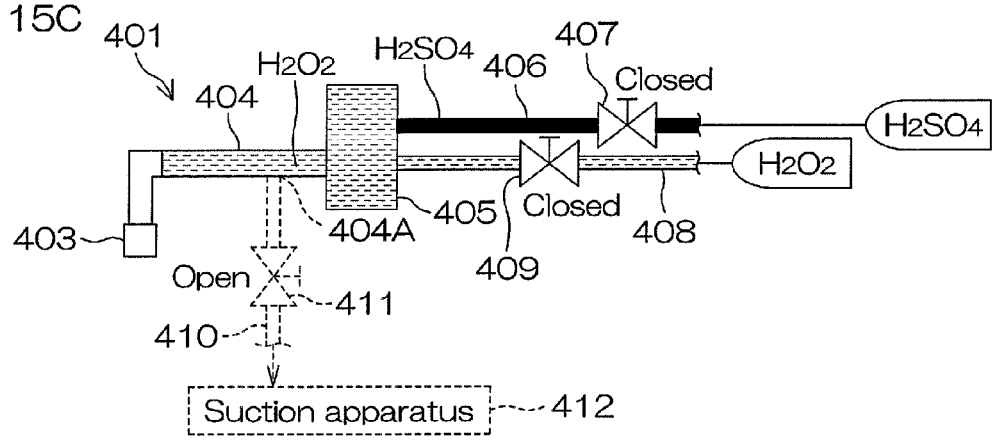

On the other hand, in the hydrogen peroxide solution supplying step, the hydrogen peroxide solution valve 409 is opened while maintaining the sulfuric acid valve 407 in the closed state as shown in FIG. 15B. Only the hydrogen peroxide solution is thereby supplied to the mixing portion 405 upon flowing through the interior of the hydrogen peroxide solution piping 409 without the sulfuric acid flowing through the interior of the sulfuric acid piping 406. The hydrogen peroxide solution supplied to the mixing portion 405 is provided to the SPM nozzle 403 via the interior of the SPM supplying piping 404 and discharged from the SPM nozzle 403. The hydrogen peroxide solution from the SPM nozzle 403 is supplied to the upper surface of the substrate.

After the discharge of the hydrogen peroxide solution from the SPM nozzle 403 is stopped, the tip surface of the SPM is positioned near the tip of the SPM supplying piping 404. Also, when, as indicated by broken lines FIG. 15C, an SPM suction piping 410 is branched from a branch position 404A at an intermediate portion of the SPM supplying piping 404 and a suction apparatus 412 is connected via a suction valve 411 to the SPM suction piping 410, the suction valve 411 is opened after the discharge of the hydrogen peroxide solution from the SPM nozzle 403 is stopped and the SPM in the SPM supplying piping 404 further downstream than the branch position 404A is suctioned. The suctioning of the SPM is performed until the tip surface of the SPM is retracted to a predetermined standby position at an intermediate portion of the SPM supplying piping 404.

Figure 15D:
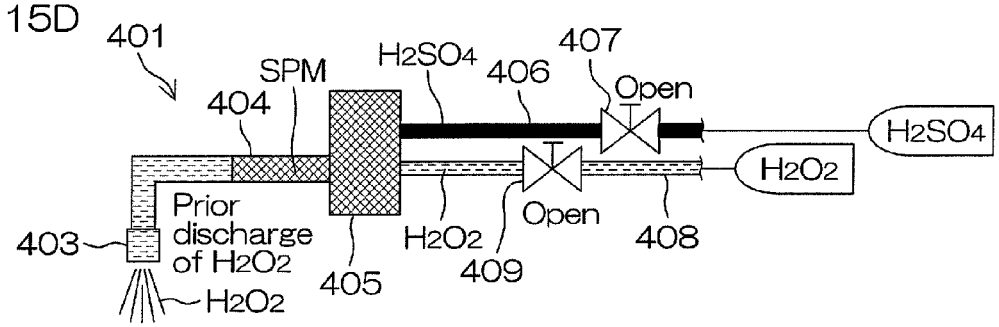

Therefore, at the start of SPM supplying in the resist removing process performed on the next substrate W, the hydrogen peroxide solution remains in the interior of the SPM supplying piping 404. Therefore, when the sulfuric acid valve 407 and the hydrogen peroxide solution valve 409 are opened to supply the SPM and the SPM from the mixing portion 405 is supplied to the SPM supplying piping 404, the hydrogen peroxide solution remaining in the SPM supplying piping 404 is supplied prior to the SPM to the SPM nozzle 403 as shown in FIG. 15D and consequently, the hydrogen peroxide solution is discharged prior to the SPM from the SPM nozzle 403.

Before the resist removing process is preformed, wet etching may be applied to the substrate to remove a silicon oxide film, etc., from the front surface of the substrate. The wet etching is a process of supplying hydrofluoric acid (HF) to the front surface of the substrate. In this case, the front surface of the substrate after wet etching exhibits hydrophobicity (for example, a contact angle of no less than 90 degrees). The supply of the SPM is performed in continuation to the wet etching (HF process).

However, if when the front surface of the substrate exhibits hydrophobicity, the hydrogen peroxide solution is supplied to the front surface of the substrate prior to the SPM, the contact angle of the hydrogen peroxide solution on the substrate front surface will be large. Therefore, the SPM will not spread as a liquid film but form droplets. When the SPM forms droplets, gas-liquid interfaces of the SPM and the substrate front surface increase. Consequently, particles may form on the front surface of the substrate after the series of processes.

The performing of pre-dispensing, by which the hydrogen peroxide solution in the interior of the SPM supplying piping 404 is expelled, prior to the supply of SPM may be considered to avoid the prior discharge of the hydrogen peroxide solution. However, to execute pre-dispensing, the SPM nozzle 403 must normally be returned once to a home position, therefore requiring moving time for the SPM nozzle 403 and operation time for draining are required, and consequently, the throughput of the apparatus may decrease. There is also a problem in that the hydrogen peroxide solution released by pre-dispensing is normally drained and, as a result of draining the hydrogen peroxide solution that is primarily not required to be drained, the consumption of the hydrogen peroxide solution increases.

On the other hand, with the second and third embodiments, the sulfuric acid is supplied to the substrate W prior to the SPM in the start of the subsequent supplying of the SPM. Prior supplying of the hydrogen peroxide solution can thus be prevented reliably at the start of the subsequent supplying of the SPM. Prior supplying of the hydrogen peroxide solution to the substrate W can thus be prevented reliably without causing an increase of the SPM consumption amount or a decrease of throughput, and therefore the formation of particles on the substrate W front surface can be suppressed or prevented even when the front surface of the substrate W exhibits hydrophobicity as a result of the etching process.

Although three preferred embodiments of the present invention were described above, the present invention may be implemented in other modes.

For example, although with each of the preferred embodiments, the case where the substrate W is heated by the infrared heater 58 before the SPM supplying step was described, the heating step may be omitted.

Also, although with the first embodiment, the case where the carbonated water, which is an example of an antistatic liquid, is supplied to the substrate W before the SPM supplying step, the antistatic liquid supplying step may be omitted. In this case, in addition to the antistatic liquid supplying step, the first hydrogen peroxide solution supplying step of removing the antistatic liquid from the substrate W before the SPM supplying step may be omitted as in a modified process example shown in FIG. 16.

An arrangement combining the arrangement of the third embodiment with the first embodiment is also possible. Specifically, one end of a sulfuric acid suction piping 71, arranged to suction the sulfuric acid inside the sulfuric acid piping 18, may be branchingly connected to a branch position 23A in the sulfuric acid piping 18 between the mixing valve 16 and the sulfuric acid valve 19 as indicated by alternate long and two short dashes lines in FIG. 2. A sulfuric acid suction valve 72 is interposed in the sulfuric acid suction piping 71 and the other end of the sulfuric acid suction piping 71 is connected to a suction apparatus 73. The suction apparatus 73 is put in a constantly actuated state, and when the sulfuric acid suction valve 72 is opened, the interior of the sulfuric acid suction piping 71 is evacuated and the sulfuric acid in the interior of the sulfuric acid suction piping 71 further downstream than the sulfuric acid valve 19 is suctioned via the sulfuric acid suction piping 71 by the suction apparatus 73.

Also, as indicated by alternate long and two short dashes line in FIG. 2, one end of a hydrogen peroxide solution suction piping 74, arranged to suction the hydrogen peroxide solution inside the hydrogen peroxide solution piping 23, is branchingly connected to a branch position 23A in the hydrogen peroxide solution piping 23 between the mixing valve 16 and the hydrogen peroxide solution valve 24. A hydrogen peroxide solution suction valve 75 is interposed in the hydrogen peroxide solution suction piping 74 and the other end of the hydrogen peroxide solution suction piping 74 is connected to the suction apparatus 73. When the hydrogen peroxide solution suction valve 75 is opened, the interior of the hydrogen peroxide solution suction piping 74 is evacuated and the hydrogen peroxide solution present in the interior of the hydrogen peroxide solution piping 23 further downstream than the hydrogen peroxide solution valve 24 is suctioned via the hydrogen peroxide solution suction piping 74 by the suction apparatus 73. With the present preferred embodiment, a suction unit is arranged by the suction apparatus 73, the hydrogen peroxide solution suction piping 74, and the hydrogen peroxide solution suction valve 75. The suction apparatus 73 arranged to suction the sulfuric acid and a suction apparatus arranged to suction the hydrogen peroxide solution may be provided separately instead.

Figure 16:
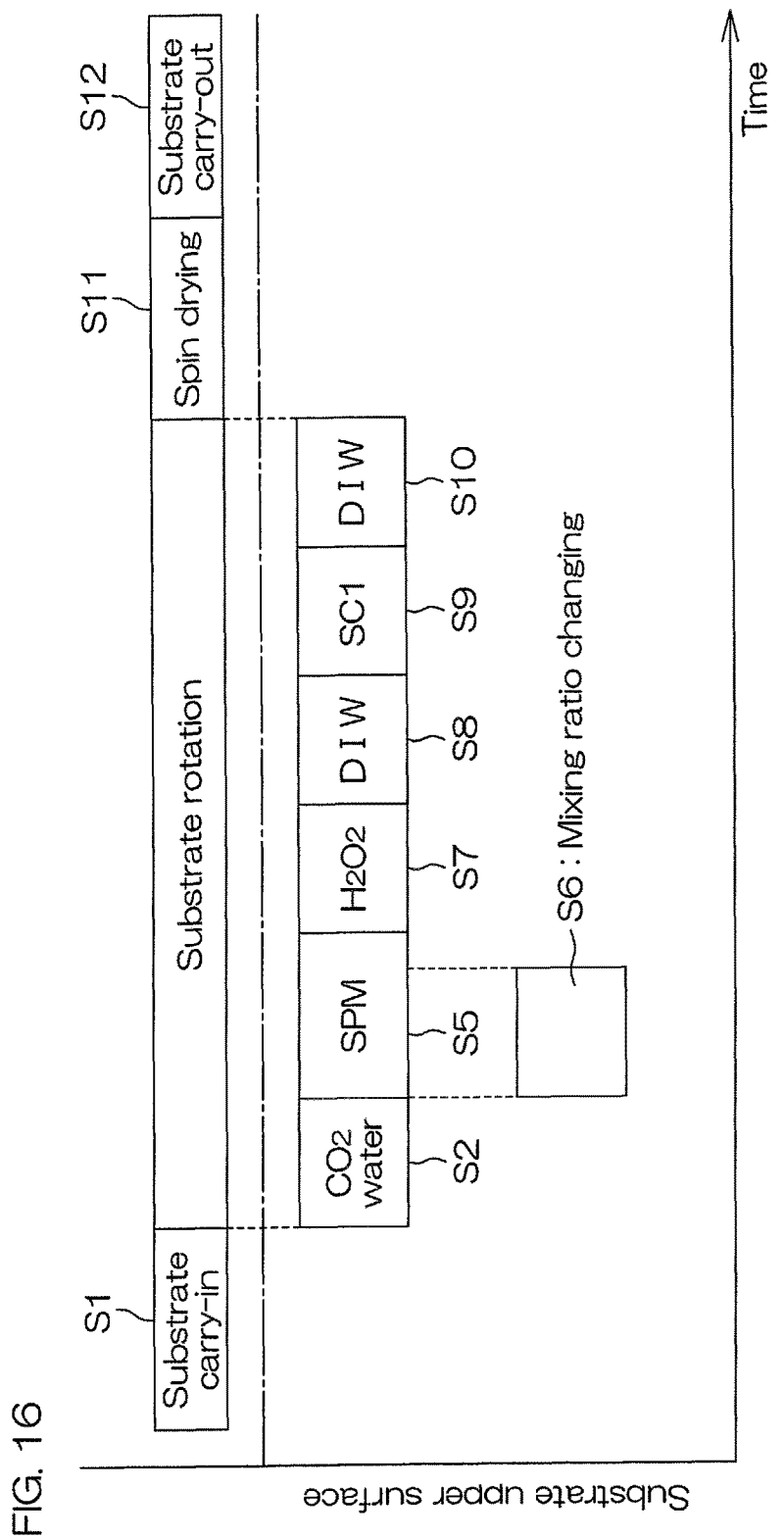
FIG. 16 is an outline time chart of a modified process example of the first embodiment performed by the processing unit shown in FIG. 2.

A case of executing the modified process example shown in FIG. 16 in the arrangement combining the third embodiment with the first embodiment shall now be considered. In this case, after the end of the hydrogen peroxide solution supplying step (step S7 of FIG. 16), the hydrogen peroxide solution present in the interior of the first chemical solution piping 14 and the interior of the hydrogen peroxide solution piping 23 is suctioned. Specifically, the controller 3 opens the hydrogen peroxide solution suction valve 75 while maintaining the hydrogen peroxide solution valve 24 in the closed state. The action of the suction apparatus 73 that is put in the constantly actuated state is thereby made effective and the hydrogen peroxide solution present in the interior of the first chemical solution piping 14 and the hydrogen peroxide solution present in the interior of the hydrogen peroxide solution piping 23 further downstream than the hydrogen peroxide solution valve 24 are suctioned by the suction apparatus 73 via the hydrogen peroxide solution suction piping 74. All of the hydrogen peroxide solution present in the first chemical solution piping 14 and a portion of the hydrogen peroxide solution and a portion of the hydrogen peroxide solution present in the interior of the hydrogen peroxide solution piping 23 are eliminated and the tip surface of the hydrogen peroxide solution is retracted significantly to an intermediate portion of the hydrogen peroxide solution piping 23. After elapse of a predetermined time, the controller 3 closes the hydrogen peroxide solution suction valve 75 and the suctioning of the interior of the hydrogen peroxide solution piping 23 and the interior of the first chemical solution piping 14 is thereby ended.

At the start of the SPM supplying step (step S5 of FIG. 16) in the process (process example of FIG. 16) performed on the next substrate W, although the tip surface of the hydrogen peroxide solution is significantly retracted to the intermediate portion of the hydrogen peroxide solution piping 23, the tip surface of the sulfuric acid is positioned at the tip of the sulfuric acid piping 18. Therefore, when in the SPM supplying step (step S5 of FIG. 16), the controller 3 opens the sulfuric acid valve 19 and the hydrogen peroxide solution valve 24 at the same time, the sulfuric acid from the sulfuric acid piping 18 is supplied to the mixing valve 16 before the hydrogen peroxide solution from the hydrogen peroxide solution piping 23 and consequently, the sulfuric acid is discharged in advance from the first chemical solution nozzle 11. The actions and effects of the third embodiment are thereby exhibited in addition to the actions and effects of the first embodiment.

The modified process example shown in FIG. 16 may also be executed in an arrangement combining the second embodiment with the first embodiment. In this case, the controller 3 performs valve opening/closing operations equivalent to the valve opening/closing operations shown in FIGS. 13A to 13E. The actions and effects of the second embodiment are thereby exhibited in addition to the actions and effects of the first embodiment.

Also, although with the first embodiment, the case where the SPM and the hydrogen peroxide solution are discharged from a nozzle (first chemical solution nozzle 11) in common was described, the SPM and the hydrogen peroxide solution may be discharged from separate nozzles.

Also, although with the first embodiment, the case where the SPM is supplied to the substrate W in the state where the heating by the infrared heater 58 is stopped was described, the substrate W may be heated by the infrared heater 58 in the state where the SPM is held on the substrate W. Also, the heating apparatus that heats the substrate W is not restricted to the infrared heater 58 and may be an electric heater that includes electric heating wire.

Also, although with the above-described first embodiment, the case where the entire upper surface of the substrate W is covered by the liquid film of the SPM while making the first chemical solution nozzle 11 discharge the SPM was described, the controller 3 may rotate the substrate W at a low rotation speed (for example, 1 to 30 rpm) or stop the rotation of the substrate W and stop the discharge of the SPM from the first chemical solution nozzle 11 after the mixing ratio of the sulfuric acid and the hydrogen peroxide solution reaches the stripping mixing ratio to make the SPM liquid film, covering the entire upper surface of the substrate W, be held on the substrate W in the state where the discharge of the SPM is stopped.

Also, although with the first embodiment, the case where the discharge of the SPM in the SPM supplying step (step S5 of FIG. 5) is started in the state where the heating of the substrate W, etc., by the infrared heater 58 is stopped was described, the heating of the substrate W, etc., by the infrared heater 58 may be started (restarted) in the middle of the SPM supplying step. Specifically, although the temperature of the SPM is comparatively low at an initial stage of the SPM supplying step, the temperature of the SPM increases thereafter and therefore the heating of the substrate W, etc., by the infrared heater 58 may be started, for example, from a latter half of the SPM supplying step.

Also, although with the first embodiment, the case where the spin chuck 5 is a clamping type chuck that includes the plurality of chuck pins 8 was described, the spin chuck 5 may instead be a vacuum type chuck with which the lower surface (rear surface) of the substrate W is suctioned onto an upper surface of the spin base 7 (suction base).

Also, although with the first embodiment, the case where the first chemical solution nozzle 11 and the second chemical solution nozzle 29 are mounted on separate nozzle arms was described, these may be mounted on a nozzle arm in common. Similarly, the infrared heater 58 may be mounted on an arm in common with the first chemical solution nozzle 11 or other processing liquid nozzle that discharges a processing liquid. Also, although case where the first rinse liquid nozzle 36 and the second rinse liquid nozzle 37 are mounted on a nozzle arm in common was described, these may be mounted on separate nozzle arms.

Also, although with each of the second and third embodiments, the case where just the interior of the hydrogen peroxide solution piping 124 is suctioned after supplying the SPM to the substrate W was described, not only the interior of the hydrogen peroxide solution piping 124 but the interior of the sulfuric acid piping 117 may also be suctioned in accompaniment. In this case, specifically, the controller 103 opens the sulfuric acid suction valve 122 while maintaining the sulfuric acid valve 118 in the closed state. The action of the suction apparatus 123 that is put in the constantly actuated state is thereby made effective and the sulfuric acid present in the interior of the sulfuric acid piping 117 further downstream than the sulfuric acid valve 118 is suctioned by the suction apparatus 123 via the sulfuric acid suction piping 121. Although in this process, a tip surface of the sulfuric acid is retracted significantly from the tip of the sulfuric acid piping 117 by the suctioning of the interior of the sulfuric acid piping 117, the opening time of the sulfuric acid suction valve 122 must be set so that the distance of retraction of the tip surface of the sulfuric acid from the tip of the sulfuric acid piping 117 is shorter than the distance of retraction of the tip surface of the hydrogen peroxide solution from the tip of the hydrogen peroxide solution piping 124, and in this case, the sulfuric acid is supplied prior to the SPM at the start of the subsequent SPM supplying step (step S25 of FIG. 12).

Also, although with each of the second and third embodiments, the case where hydrofluoric acid (HF) is used as an example of the etching solution supplied to the substrate W in the etching supplying step was described, as other examples of etching solutions, hydrofluoric nitric acid (mixed solution of hydrofluoric acid and nitric acid ($HNO_3$)), buffered hydrofluoric acid (BHF), ammonium fluoride, HFEG (mixed solution of hydrofluoric acid and ethylene glycol), etc., may be used. When any of these are used as the etching solution, the front surface of the substrate W exhibits hydrophobicity after the etching process.

Also, although with each of the second and third embodiments, the case where the SPM from the SPM supplying apparatus 106 or 206 is used to remove the resist was described as an example, the SPM may also be used for cleaning, such as for removing a polymer after removal of an oxide film, etc.

Also, although with each of the preferred embodiments, the case where the substrate processing apparatus 1, 101, or 201 is an apparatus for processing the disk-shaped substrate W was described, the substrate processing apparatus 1, 101, or 201 may instead be an apparatus for processing a polygonal substrate, such as a substrate for liquid crystal display device, etc.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

The present application corresponds to Japanese Patent Application No. 2013-221489 filed on Oct. 24, 2013 in the Japan Patent Office and Japanese Patent Application No. 2013-251192 filed on Dec. 4, 2013 in the Japan Patent Office, and the entire disclosures of these applications are incorporated herein by reference.

What is claimed is:

1. A substrate processing method that is a method for removing a resist having a cured layer on its surface and having an uncured layer inside, from a surface of a substrate formed with a pattern disposed inside the resist, the method comprising:
    an SPM supplying step of supplying an SPM, formed by mixing sulfuric acid and a hydrogen peroxide solution, to the surface of the substrate to bring the SPM into contact with the resist;
    a liquid temperature increasing step of changing, while the SPM is supplied to the surface of the substrate, a mixing ratio of the sulfuric acid and the hydrogen peroxide solution used to form the SPM to increase the liquid temperature of the SPM on the resist by decreasing the flow rate of sulfuric acid mixed with hydrogen peroxide water and increasing the flow rate of the hydrogen peroxide solution that is mixed with the sulfuric acid in the SPM supplying step, from a temperature lower than a peeling temperature at which the resist can be peeled off to the peeling temperature, so that the uncured layer is exposed from the cured layer;
    an anti-static liquid supplying step of supplying a conductive anti-static liquid with a higher specific resistance than the SPM to the surface of the substrate before the SPM supplying step; and
    a hydrogen peroxide solution supplying step of supplying the hydrogen peroxide solution to the surface of the substrate after the anti-static liquid supplying step and before the SPM supplying step to rinse off the anti-static liquid remaining on the substrate.

2. The substrate processing method according to claim 1, further comprising: a heating step of heating the substrate before the SPM supplying step to make the temperature of the substrate approach the liquid temperature of the SPM at the start of the liquid temperature increasing step.

3. The substrate processing method according to claim 1, wherein the hydrogen peroxide solution supplying step further comprises supplying the hydrogen peroxide solution to the substrate at a lower temperature than the liquid temperature of the SPM at the start of the liquid temperature increasing step and
    the substrate processing method further comprises: a heating step of heating the substrate and the hydrogen peroxide solution on the substrate in parallel to the hydrogen peroxide solution supplying step to make the temperature of the substrate approach the liquid temperature of the SPM at the start of the liquid temperature increasing step.

4. The substrate processing method according to claim 1, wherein the SPM supplying step includes a step of supplying the sulfuric acid to a mixing portion via a sulfuric acid piping, supplying the hydrogen peroxide solution to the mixing portion via a hydrogen peroxide solution piping, and supplying the SPM, formed by the mixing of the sulfuric acid and the hydrogen peroxide solution at the mixing portion, to the substrate, and the substrate processing method further comprises;
    a hydrogen peroxide solution supplying step of supplying the hydrogen peroxide solution to the substrate by supplying the hydrogen peroxide solution to the mixing portion via the hydrogen peroxide solution piping after the SPM supplying step is ended; and
    a suction step of suctioning the interior of the hydrogen peroxide solution piping after the hydrogen peroxide solution supplying step is ended.

5. The substrate processing method according to claim 4, wherein the SPM supplying step includes a simultaneous valve opening step of simultaneously opening a sulfuric acid valve arranged to open and close the sulfuric acid piping and a hydrogen peroxide solution valve arranged to open and close the hydrogen peroxide solution piping.

6. A substrate processing method that is a method for removing a resist having a cured layer on its surface and having an uncured layer inside, from a surface of a substrate formed with a pattern disposed inside the resist, the method comprising:
    an SPM supplying step of supplying an SPM, formed by mixing sulfuric acid and a hydrogen peroxide solution, to the surface of the substrate to bring the SPM into contact with the resist; and
    a liquid temperature increasing step of continuously changing, while the SPM is supplied to the surface of the substrate, a mixing ratio of the sulfuric acid and the hydrogen peroxide solution used to form the SPM to increase the liquid temperature of the SPM on the resist by decreasing the flow rate of sulfuric acid mixed with hydrogen peroxide water and increasing the flow rate of the hydrogen peroxide solution that is mixed with the sulfuric acid in the SPM supplying step, from a temperature lower than a peeling temperature at which the resist can be peeled off to the peeling temperature, so that the uncured layer is exposed from the cured layer.

7. The substrate processing method according to claim 6, further comprising: a heating step of heating the substrate before the SPM supplying step to make the temperature of the substrate approach the liquid temperature of the SPM at the start of the liquid temperature increasing step.

8. The substrate processing method according to claim 6, wherein the SPM supplying step includes a step of supplying the sulfuric acid to a mixing portion via a sulfuric acid piping, supplying the hydrogen peroxide solution to the mixing portion via a hydrogen peroxide solution piping, and supplying the SPM, formed by the mixing of the sulfuric acid and the hydrogen peroxide solution at the mixing portion, to the substrate, and the substrate processing method further comprises;
    a hydrogen peroxide solution supplying step of supplying the hydrogen peroxide solution to the substrate by supplying the hydrogen peroxide solution to the mixing portion via the hydrogen peroxide solution piping after the SPM supplying step is ended; and
    a suction step of suctioning the interior of the hydrogen peroxide solution piping after the hydrogen peroxide solution supplying step is ended.

9. The substrate processing method according to claim 8, wherein the SPM supplying step includes a simultaneous valve opening step of simultaneously opening a sulfuric acid valve arranged to open and close the sulfuric acid piping and a hydrogen peroxide solution valve arranged to open and close the hydrogen peroxide solution piping.

10. The substrate processing method according to claim 6, further comprising: an anti-static liquid supplying step of supplying a conductive anti-static liquid with a higher specific resistance than the SPM to the substrate before the SPM supplying step.

11. The substrate processing method according to claim 10, further comprising: a hydrogen peroxide solution supplying step of supplying the hydrogen peroxide solution to the substrate after the anti-static liquid supplying step and before the SPM supplying step to rinse off the anti-static liquid remaining on the substrate.

12. The substrate processing method according to claim 11, wherein the hydrogen peroxide solution supplying step further comprises supplying the hydrogen peroxide solution to the substrate at a lower temperature than the liquid temperature of the SPM at the start of the liquid temperature increasing step and the substrate processing method further comprises a heating step of heating the substrate and the hydrogen peroxide solution on the substrate in parallel to the hydrogen peroxide solution supplying step to make the temperature of the substrate approach the liquid temperature of the SPM at the start of the liquid temperature increasing step.

13. A substrate processing method that is a method for removing a resist having a cured layer on its surface and having an uncured layer inside, from a surface of a substrate formed with a pattern disposed inside the resist, the method comprising:

a hydrogen peroxide solution supplying step of supplying a hydrogen peroxide solution to the surface of the substrate;

an SPM supplying step of supplying an SPM, formed by mixing sulfuric acid and a hydrogen peroxide solution, to the surface of the substrate to replace the hydrogen peroxide solution in contact with the resist with the SPM continuously to the hydrogen peroxide solution supplying step; and a liquid temperature increasing step of changing, while the SPM is supplied to the surface of the substrate, a mixing ratio of the sulfuric acid and the hydrogen peroxide solution used to form the SPM to increase the liquid temperature of the SPM on the resist by decreasing the flow rate of sulfuric acid mixed with hydrogen peroxide water and increasing the flow rate of the hydrogen peroxide solution that is mixed with the sulfuric acid in the SPM supplying step, from a temperature lower than a peeling temperature at which the resist can be peeled off to the peeling temperature, so that the uncured layer is exposed from the cured layer.

14. The substrate processing method according to claim 13, further comprising: a heating step of heating the substrate before the SPM supplying step to make the temperature of the substrate approach the liquid temperature of the SPM at the start of the liquid temperature increasing step.

15. The substrate processing method according to claim 13, wherein the SPM supplying step includes a step of supplying the sulfuric acid to a mixing portion via a sulfuric acid piping, supplying the hydrogen peroxide solution to the mixing portion via a hydrogen peroxide solution piping, and supplying the SPM, formed by the mixing of the sulfuric acid and the hydrogen peroxide solution at the mixing portion, to the substrate, and the substrate processing method further comprises:

a hydrogen peroxide solution supplying step of supplying the hydrogen peroxide solution to the substrate by supplying the hydrogen peroxide solution to the mixing portion via the hydrogen peroxide solution piping after the SPM supplying step is ended; and a suction step of suctioning the interior of the hydrogen peroxide solution piping after the hydrogen peroxide solution supplying step is ended.

16. The substrate processing method according to claim 15, wherein the SPM supplying step includes a valve opening step of simultaneously opening a sulfuric acid valve arranged to open and close the sulfuric acid piping and a hydrogen peroxide solution valve arranged to open and close the hydrogen peroxide solution piping.

17. The substrate processing method according to claim 13, further comprising: an anti-static liquid supplying step of supplying a conductive anti-static liquid with a higher specific resistance than the SPM to the substrate before the SPM supplying step.

18. The substrate processing method according to claim 17, wherein the hydrogen peroxide solution supplying step is executed after the anti-static liquid supplying step to rinse off the anti-static liquid remaining on the substrate.

19. The substrate processing method according to claim 18, wherein the hydrogen peroxide solution supplying step further comprises supplying the hydrogen peroxide solution to the substrate at a lower temperature than the liquid temperature of the SPM at the start of the liquid temperature increasing step and heating the substrate and the hydrogen peroxide solution on the substrate in parallel to the hydrogen peroxide solution supplying step to make the temperature of the substrate approach the liquid temperature of the SPM at the start of the liquid temperature increasing step.

* * * * *